US010868252B2

(12) United States Patent
Yoshinari et al.

(10) Patent No.: US 10,868,252 B2
(45) Date of Patent: Dec. 15, 2020

(54) ORGANIC ELECTRONICS MATERIAL AND USE THEREOF

(71) Applicant: HITACHI CHEMICAL COMPANY, LTD., Tokyo (JP)

(72) Inventors: Yuki Yoshinari, Tsukuba (JP); Kenichi Ishitsuka, Nagareyama (JP); Tomotsugu Sugioka, Tsukuba (JP); Shigeaki Funyuu, Tsuchiura (JP); Shunsuke Ueda, Tsukuba (JP); Naoki Asano, Tsukuba (JP); Hiroshi Takaira, Hitachinaka (JP); Iori Fukushima, Tsukuba (JP); Daisuke Ryuzaki, Tsuchiura (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 372 days.

(21) Appl. No.: 15/759,005

(22) PCT Filed: Sep. 7, 2016

(86) PCT No.: PCT/JP2016/076245
§ 371 (c)(1),
(2) Date: Mar. 9, 2018

(87) PCT Pub. No.: WO2017/043502
PCT Pub. Date: Mar. 16, 2017

(65) Prior Publication Data
US 2019/0305225 A1 Oct. 3, 2019

(30) Foreign Application Priority Data
Sep. 10, 2015 (JP) .................. 2015-178625

(51) Int. Cl.
*H01L 51/00* (2006.01)
*C08G 61/12* (2006.01)
*C09D 11/102* (2014.01)
*C09D 11/52* (2014.01)
*G02F 1/13357* (2006.01)
*C08L 101/12* (2006.01)
*H01L 51/50* (2006.01)
*C09D 165/00* (2006.01)
*C09K 11/06* (2006.01)

(52) U.S. Cl.
CPC .......... *H01L 51/0035* (2013.01); *C08G 61/12* (2013.01); *C08G 61/124* (2013.01); *C08L 101/12* (2013.01); *C09D 11/102* (2013.01); *C09D 11/52* (2013.01); *C09D 165/00* (2013.01); *C09K 11/06* (2013.01); *G02F 1/1336* (2013.01); *H01L 51/0043* (2013.01); *H01L 51/50* (2013.01); *C08G 2261/124* (2013.01); *C08G 2261/135* (2013.01); *C08G 2261/1412* (2013.01); *C08G 2261/1644* (2013.01); *C08G 2261/1646* (2013.01); *C08G 2261/18* (2013.01); *C08G 2261/22* (2013.01); *C08G 2261/228* (2013.01); *C08G 2261/312* (2013.01); *C08G 2261/314* (2013.01); *C08G 2261/3142* (2013.01); *C08G 2261/3162* (2013.01); *C08G 2261/3222* (2013.01); *C08G 2261/3241* (2013.01); *C08G 2261/334* (2013.01); *C08G 2261/41* (2013.01); *C08G 2261/411* (2013.01); *C08G 2261/51* (2013.01); *C08G 2261/512* (2013.01); *C08G 2261/76* (2013.01); *C08G 2261/95* (2013.01); *H01L 51/5056* (2013.01)

(58) Field of Classification Search
USPC .................................. 528/499, 500, 501, 502
See application file for complete search history.

(56) References Cited

U.S. PATENT DOCUMENTS

| | | | |
|---|---|---|---|
| 5,516,877 A | 5/1996 | Bales et al. | |
| 6,368,732 B1 | 4/2002 | Jin et al. | |
| 2004/0018386 A1 | 1/2004 | Naito et al. | |
| 2012/0074360 A1 | 3/2012 | Funyuu et al. | |
| 2014/0335375 A1 | 11/2014 | Funyuu et al. | |

FOREIGN PATENT DOCUMENTS

| | | |
|---|---|---|
| CN | 101945925 A | 1/2011 |
| JP | 2000-036390 A | 2/2000 |
| JP | 2001-114873 A | 4/2001 |
| JP | 2003-213002 A | 7/2003 |
| JP | 2003-297581 A | 10/2003 |
| JP | 2003-347061 A | 12/2003 |
| JP | 2005-075913 A | 3/2005 |
| JP | 2005-075948 A | 3/2005 |
| JP | 2006-279007 A | 10/2006 |
| JP | 2007-56362 A | 3/2007 |

(Continued)

OTHER PUBLICATIONS

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983.

(Continued)

*Primary Examiner* — Terressa Boykin
(74) *Attorney, Agent, or Firm* — Fitch, Even, Tabin & Flannery, LLP

(57) ABSTRACT

An organic electronic material containing a charge transport polymer for which, in a molecular weight distribution chart measured by GPC, the area ratio accounted for by components having a molecular weight of less than 20,000 is not more than 40%, and the area ratio accounted for by components having a molecular weight of 500 or less is not more than 1%.

23 Claims, 2 Drawing Sheets

(56) References Cited

FOREIGN PATENT DOCUMENTS

| | | |
|---|---|---|
| JP | 2009-287000 A | 12/2009 |
| JP | 2010-198980 A | 9/2010 |
| JP | 2015-126115 A | 7/2015 |
| JP | 2016-86160 A | 5/2016 |
| KR | 10-2014-0106618 A | 9/2014 |
| WO | 2010/140553 A1 | 12/2010 |
| WO | 2011/042983 A1 | 4/2011 |
| WO | 2012/147493 A1 | 11/2012 |
| WO | 2013/081031 A1 | 4/2015 |

OTHER PUBLICATIONS

Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906.

Nakagawa, T., Ku, S., Wong, K., Adachi, C. Electroluminescence based on thermally activated delayed fluorescence generated by a spirobifluorene donor—acceptor structure. Chem. Commun., 2012,48, 9580-9582.

Lee, S., Yasuda, T., Nomura, H., and Adachi, C. High-efficiency organic light-emitting diodes utilizing thermally activated delayed fluorescence from triazine-based donor—acceptor hybrid molecules Appl. Phys. Lett. 101, 093306 (2012); doi: 10.1063/1.4749285.

Zhang Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012).

Tanaka, H., Shizu, K., Miyazakiab, H., and Adachi, C. Efficient green thermally activated delayed fluorescence (TADF) from a phenoxazine-triphenyltriazine (PXZ-TRZ) derivative. Chem. Comm., 48, 11392 (2012).

Uoyama, H., Goushi, K., Shizu, K., Nomura, H., and Adachi, C. Highly efficient organic light-emitting diodes from delayed fluorescence. Nature, 492, 234 (2012).

Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013).

Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013).

Serevicius, T., Nakagawa, T., Kuo, M., Cheng, S., Wong, K., Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013).

Nasu, K, Nakagawa, T., Nomura, H., Lin, C., Cheng, C., Tseng, M., Yasudaad, T., and Adachi, C. A highly luminescent spiro-anthracenone-based organic light-emitting diode exhibiting thermally activated delayed fluorescence Chem. Comm., 49, 10385 (2013).

Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014).

T. Damerau et al., Photoreactivity of poly(p-phenylphenylenevinylene, Polymer Bulletin, 32, pp. 201-205, 1994 (cited in a Notice of Submission of Publications dated Aug. 20, 2019 in counterpart JP App.).

Heidi Martelock et al., Structural Modifications of poly(1,4-phenylenevinylene) to soluble, Fusible, Liquid-Crystalline Products, Makromol Chem. 192, 967-979, 1991 (cited in a Notice of Submission of Publications dated Aug. 20, 2019 in counterpart JP App.).

"GPC Method (SEC method) Introduction," Tosoh Technical Report No. T1001, Oct. 1, 2013 (cited in a Notice of Submission of Publications dated Aug. 20, 2019 in counterpart JP App.).

Basic Master Polymer Chemistry, First Edition, pp. 35 to 39, Mar. 20, 2011 (cited in a Notice of Submission of Publications dated Aug. 20, 2019 in counterpart JP App.).

Basic Polymer Science, First Edition, pp. 46 to 49, 107 to 109 Jul. 1, 2006 (cited in a Notice of Submission of Publications dated Aug. 20, 2019 in counterpart JP App.).

Fujishima et al., Study on Relationship between Electroluminescence Properties and Molecular Weight Distribution of Poly(9,9'-dioctylfluorene) Using Photoluminescence, XP-001236836, Japanese Journal of Applied Physics vol. 44, 1B, 2005, pp. 546-550, (cited in Search Report in counterpart EP Application dated Apr. 4, 2019.).

Karl-Heinz Weinfurtner et al., Highly efficient pure blue electroluminescence from polyfluorene: Influence of the molecular weight distribution on the aggregation tendency, Applied Physics Letters, vol. 76, No. 18 May 1, 2000, pp. 2502-2504, (cited in Search Report in counterpart EP Application dated Apr. 4, 2019.).

ORGANIC ELECTRONICS MATERIAL AND USE THEREOF

CROSS-REFERENCE TO RELATED APPLICATIONS

This application is a U.S. national phase application filed under 35 U.S.C. § 371 of International Application No. PCT/JP2016/076245, filed Sep. 7, 2016, designating the United States, which claims priority from Japanese Patent Application No. 2015-178625 filed Sep. 10, 2015, which are hereby incorporated herein by reference in their entirety.

TECHNICAL FIELD

Embodiments of the present invention relate to an organic electronic material, an ink composition, an organic layer, an organic electronic element, an organic electroluminescent element (hereafter also referred to as an "organic EL element"), a display element, an illumination device, and a display device.

BACKGROUND ART

Organic EL elements are attracting attention for application to large-surface area solid state light sources, for use instead of incandescent lamps or gas-filled lamps or the like. Further, organic EL elements are also attracting much attention as the leading candidate for self-light-emitting displays that can replace liquid crystal displays (LCD) in the field of flat panel displays (FPD), and actual production of such self-light-emitting displays is now proceeding.

Depending on the organic material used, organic EL elements can be broadly classified into two types, namely low-molecular weight type organic EL elements that use a low-molecular weight compound, and high-molecular weight type organic EL elements that use a high-molecular weight compound. The production methods for organic EL elements are broadly classified into dry processes in which film formation is mainly performed in a vacuum system, and wet processes in which film formation is performed by plate-based printing such as relief printing or intaglio printing, or by plateless printing such as inkjet printing. Because wet processes enable simple film formation, they are expected to be an indispensable method in the production of future large-screen organic EL displays (see Patent Document 1).

PRIOR ART DOCUMENTS

Patent Document

Patent Document 1: JP 2006-279007 A

DISCLOSURE OF INVENTION

Problems Invention Aims to Solve

In order to improve the efficiency and lengthen the lifespan of organic EL elements, it is desirable to employ multiple layers of organic layers to separate the functions of the individual layers. However, in wet processes in which multilayering is performed using ink compositions, a problem can sometimes arise in that when an upper layer is applied, the solvent contained in the upper layer may dissolve the lower layer.

Generally, it is thought that if a polymer having a large molecular weight or a polymer having a branched structure is used, then an organic layer having excellent solvent resistance can be formed. However, as the molecular weight of the polymer is increased, the solubility in solvents of the polymer itself tends to deteriorate, raising the concern that forming an ink composition for use in wet processes can become difficult.

Embodiments of the present invention have been designed in light of these circumstances, and have the objects of providing an organic electronic material and an ink composition that are suited to wet processes and enable easy multilayering. Other embodiments of the present invention have the objects of providing an organic electronic element, an organic EL element, a display element, an illumination device and a display device having excellent characteristics.

Means for Solution of the Problems

One embodiment of the present invention relates to an organic electronic material containing a charge transport polymer for which, in a molecular weight distribution chart measured by GPC, the area ratio accounted for by components having a molecular weight of less than 20,000 is not more than 40%, and the area ratio accounted for by components having a molecular weight of 500 or less is not more than 1%.

Another embodiment of the present invention relates to an organic electronic material containing a charge transport polymer from which components having a molecular weight of less than 20,000 have been removed, and for which, in a molecular weight distribution chart measured by GPC, the area ratio accounted for by components having a molecular weight of less than 20,000 is not more than 40%.

Another embodiment of the present invention relates to a method for producing an organic electronic material containing a charge transport polymer for which, in a molecular weight distribution chart measured by GPC, the area ratio accounted for by components having a molecular weight of less than 20,000 is not more than 40%, the method including removing components having a molecular weight of less than 20,000 from the charge transport polymer.

Another embodiment of the present invention relates to an ink composition containing the organic electronic material described above, or an organic electronic material produced using the method described above, and a solvent.

Another embodiment of the present invention relates to an organic layer formed using the organic electronic material described above or the ink composition described above.

Another embodiment of the present invention relates to an organic electronic element provided with at least one of the above organic layer.

Another embodiment of the present invention relates to an organic electroluminescent element provided with at least one of the above organic layer.

Another embodiment of the present invention relates to a display element provided with the organic electroluminescent element described above.

Another embodiment of the present invention relates to an illumination device provided with the organic electroluminescent element described above.

Moreover, another embodiment of the present invention relates to a display device provided with the illumination device described above, and a liquid crystal element as a display unit.

Effects of the Invention

An organic electronic material and an ink composition according to embodiments of the present invention are suited to wet processes, and can form organic layers having excellent solvent resistance. Further, an organic layer that represents another embodiment of the present invention is suitable for improving the emission efficiency and emission lifespan of an organic electronic element. Moreover, an organic electronic element, an organic EL element, a display element, an illumination device and a display device according to other embodiments of the present invention exhibit excellent emission efficiency characteristics and emission lifespan characteristics.

EMBODIMENTS FOR CARRYING OUT THE INVENTION

Figure 1:
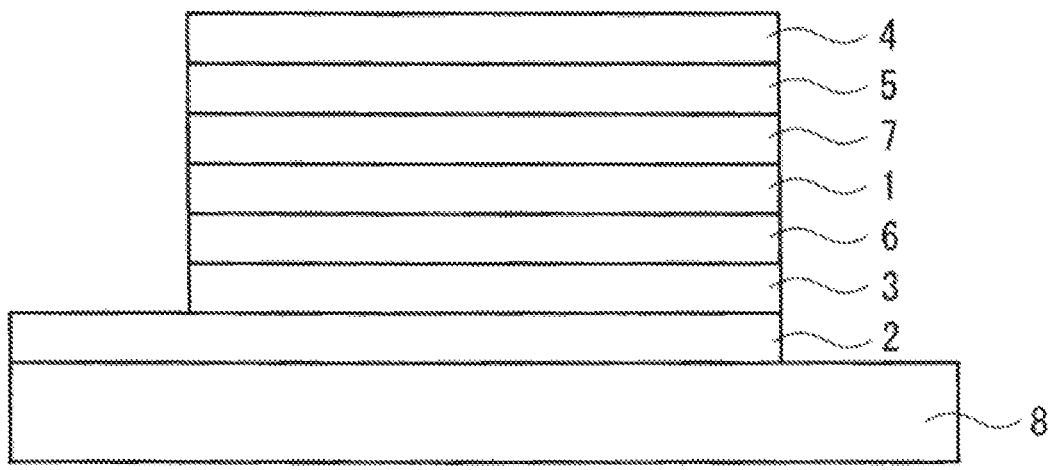
FIG. 1 is a cross-sectional schematic view illustrating one example of an organic EL element according to an embodiment of the present invention.

Embodiments of the present invention are described below, but the present invention is not limited to these embodiments.
<Organic Electronic Material>

An organic electronic material according to an embodiment of the present invention contains a charge transport polymer (hereafter also referred to as "the charge transport polymer 1") for which, in a molecular weight distribution chart measured by GPC, the area ratio accounted for by components having a molecular weight of less than 20,000 (hereafter also referred to as "low-molecular weight components") is not more than 40%, and the area ratio accounted for by components having a molecular weight of 500 or less is not more than 1%.

An organic electronic material of another embodiment contains a charge transport polymer (hereafter also referred to as "the charge transport polymer 2") from which components having a molecular weight of less than 20,000 have been removed, and for which, in a molecular weight distribution chart measured by GPC, the area ratio accounted for by components having a molecular weight of less than 20,000 is not more than 40%.

The organic electronic materials of these embodiments may contain only one type, or may contain two or more types, of the charge transport polymer having a low ratio of the above low-molecular weight components.

In this description, when the simplified expression "charge transport polymer" (or "polymer") is used, it refers to both the charge transport polymer 1 and the charge transport polymer 2 without any particular distinction.

In these embodiments, by lowering the proportion in the polymer of low-molecular weight components having a molecular weight of 20,000 or less, and suppressing the GPC area ratio of these low-molecular weight components to not more than 40%, the curability can be improved while maintaining the solubility of the polymer itself, even though the molecular weight of the overall polymer is not increased, meaning an organic layer having excellent solvent resistance can be formed. Accordingly, organic electronic materials of these embodiments are suited to applications to ink compositions for wet processes.

Although only a hypothesis, it is thought that because low-molecular weight components themselves dissolve more readily than high-molecular weight components, the residual film ratio (solvent resistance) tends to deteriorate for organic layers obtained from a polymer having a large amount of residual low-molecular weight components. In addition, when a polymer (described below) having polymerizable functional groups (crosslinking groups) at the terminals is used, it is thought that the amount of terminal crosslinking groups in the low-molecular weight components is small, and therefore the rate of crosslinking reactions is also low. Accordingly, it is thought that by reducing the proportion of these low-molecular weight components, the curability of the obtained organic layer can be improved, and the solvent resistance can be enhanced.

Moreover, in a surprising finding, it was discovered that in these embodiments, by reducing the amount of specific low-molecular weight components in the polymer that forms the organic layer, other effects were obtained in an organic EL element using this organic layer, including an improvement in the emission characteristics, a reduction in the drive voltage, an improvement in the emission efficiency, and an improvement in the emission lifespan.

Further, the reduction in the proportion of low-molecular weight components in the polymer enables the physical properties of the polymer as a charge transport material to be controlled.

[Charge Transport Polymer]
(Low-Molecular Weight Components)

First is a description of the method used for determining the component proportion of low-molecular weight components in the charge transport polymer using GPC (gel permeation chromatography).

The expression that "in a molecular weight distribution chart measured by GPC, the area ratio accounted for by components having a molecular weight of less than 20,000 (namely, low-molecular weight components) is not more than 40%" means that in a GPC chart (elution pattern) displayed in terms of elution time and detection intensity, the area ratio accounted for by components having a polystyrene-equivalent molecular weight (described below) of less than 20,000, relative to the total area of the chart, is not more than 40%. In other words, the area ratio at the low-molecular weight side of the chart having long elution times is not more than 40% of the total chart area. The total chart area is the total area beneath all of the peaks excluding solvent and impurity peaks.

The GPC measurement conditions are as follows (and are the same in the examples described below).

Apparatus: High-performance liquid chromatograph "Prominence", manufactured by Shimadzu Corporation
    Feed pump (LC-20AD)
    Degassing unit (DGU-20A)
    Autosampler (SIL-20AHT)
    Column oven (CTO-20A)
    PDA detector (SPD-M20A)
    Refractive index detector (RID-20A)
Columns: Gelpack (a registered trademark)
    GL-A160S (product number: 686-1J27)
    GL-A150S (product number: 685-1J27)
    manufactured by Hitachi Chemical Co., Ltd.

Eluent: Tetrahydrofuran (THF) (for HPLC, contains stabilizers), manufactured by Wako Pure Chemical Industries, Ltd.
Flow rate: 1 mL/min
Column temperature: 40° C.
Detection wavelength: 254 nm
Molecular weight standards: PStQuick A/B/C, manufactured by Tosoh Corporation The elution time for a polymer having a molecular weight of 20,000 can be determined using a calibration curve prepared from the elution times for polystyrene standard samples having known molecular weights.

The amount of the low-molecular weight components specified in the manner described above is preferably not more than 40%, and from the viewpoint of obtaining better curability and better uniformity of the physical properties of the material, this amount is more preferably not more than 30%, and particularly preferably 20% or less.

Moreover, the charge transport polymer 1 also has another characteristic feature in that the area ratio accounted for by components having a molecular weight of 500 or less is not more than 1%.

Generally, in a typical polymer synthesis, regardless of how high the molecular weight of the polymer becomes, the product polymer will often inevitably contain about several percent or more of unreacted monomers and oligomers (for example, compounds in which only about 1 to 4 monomer units have undergone polymerization) in which polymer chain growth has been blocked due to some type of defect in the monomer itself. These unreacted monomers and oligomers are sometimes jointly termed "defects", and the above expression that "the area ratio accounted for by components having a molecular weight of 500 or less is not more than 1%" means that almost none of these defects exist. In this case, the method used for determining the component ratio of components having a molecular weight of 500 or less is similar to the method described above for determining the component ratio of low-molecular weight compounds.

The charge transport polymer 1 can be obtained favorably and easily by removing low-molecular weight components from a polymer produced by a typical synthesis, but a polymer having smaller amounts of low-molecular weight components and defects may also be produced by controlling the monomer ratio, the reaction solvent concentration and the timing of the monomer addition and the like, so that a removal step is not necessarily required in the production process.

There are no particular limitations on the removal method employed, and any conventional method may be used. For example, removal may be performed by washing the polymer with a solvent that dissolves only the low-molecular weight components, by re-precipitation, by fractionation using fractionation GPC, or by fractionation using a dialysis membrane or the like. By using these types of typical removal methods, the aforementioned defects in the low-molecular weight components can also be removed. From the viewpoint of ease of operation, removal of the low-molecular weight components can be performed favorably by GPC fractionation, even more favorably by re-precipitation, and particularly favorably by washing with a solvent that dissolves only the low-molecular weight components.

The charge transport polymer 2 is a polymer from which low-molecular weight components having a molecular weight of less than 20,000 have been removed. Here, the term "removed" means a reduction in the amount of the low-molecular weight components having a molecular weight of less than 20,000. Accordingly, the term "removed" is a concept that not only includes removing low-molecular weight components from a polymer in which the GPC chart area ratio for these low-molecular weight components is more than 40% to a polymer in which the area ratio is not more than 40%, but also includes removing low-molecular weight components from a polymer in which the area ratio is already not more than 40% in order to further reduce the amount of low-molecular weight components.

One preferred embodiment is a charge transport polymer in which the components having a molecular weight of less than 20,000 have been reduced until the area ratio in a molecular weight distribution chart measured by GPC has decreased (from a ratio exceeding 40%) to a ratio of not more than 40%.

Figure 2:
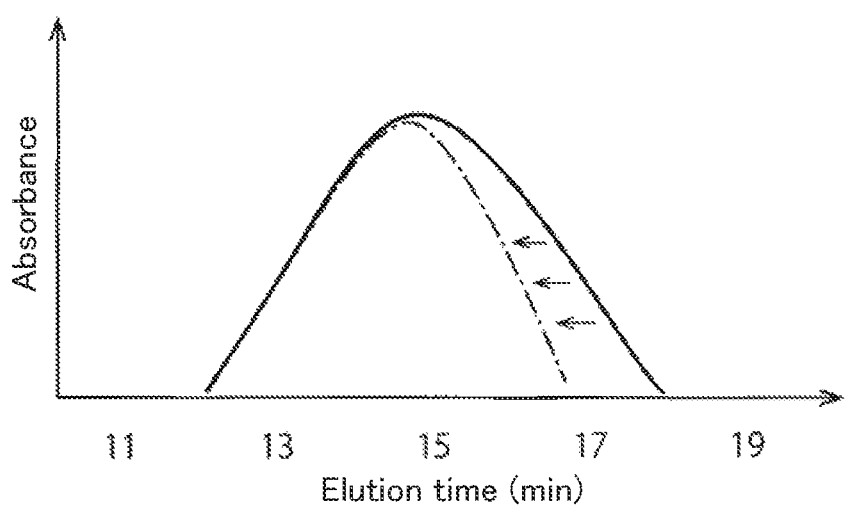
FIG. 2 is a conceptual diagram of a GPC measurement chart before and after removal of low-molecular weight components from a charge transport polymer contained in an organic electronic material according to an embodiment of the present invention.

FIG. 2 is a diagram schematically illustrating "removal of low-molecular weight components from a polymer" using a GPC molecular weight distribution chart, showing a schematic representation of the GPC measurement chart before and after removal of the low-molecular weight components. The measurement chart before removal of the low-molecular weight components (the solid line) shows detection at the low-molecular weight side at long elution times. In contrast, in the measurement chart after removal of the low-molecular weight components (the dashed line) the low-molecular weight components having long elution times have been eliminated, whereas the distribution of components at the high-molecular weight side shows no change between before and after removal of the low-molecular weight components.

(Dispersity)

The dispersity (weight average molecular weight/number average molecular weight; Mw/Mn) of the charge transport polymer is preferably broad in order to lower the crystallinity of the polymer and ensure favorable solubility in solvents, and is preferably at least 2.0, more preferably at least 2.3, and most preferably 2.5 or greater. On the other hand, from the viewpoints of suppressing fluctuations in the characteristics of the organic electronic element and enabling easier synthesis of the polymer, the dispersity is preferably not more than 20, and in order of increasing preference, is more preferably not more than 15, not more than 10, or 7 or less.

(Number Average Molecular Weight: Mn)

The number average molecular weight of the charge transport polymer can be adjusted appropriately with due consideration of the solubility in solvents and the film formability and the like. From the viewpoint of ensuring superior film formation stability and charge transport properties, the number average molecular weight is preferably at least 500, more preferably at least 1,000, even more preferably at least 2,000, even more preferably at least 3,000, and most preferably 10,000 or greater. Further, from the viewpoints of maintaining favorable solubility in solvents and facilitating the preparation of ink compositions, the number average molecular weight is preferably not more than 1,000,000, more preferably not more than 800,000, even more preferably not more than 600,000, and in order of increasing preference, most preferably not more than 100,000 or not more than 50,000.

(Weight Average Molecular Weight: Mw)

The weight average molecular weight of the charge transport polymer can be adjusted appropriately with due consideration of the solubility in solvents and the film formability and the like. From the viewpoint of ensuring superior charge transport properties, the weight average molecular weight is preferably at least 1,000, more preferably at least 5,000, and even more preferably 10,000 or greater. Further, from the viewpoints of maintaining favorable solubility in solvents and facilitating the preparation of ink compositions, the weight average molecular weight is preferably not more than 1,000,000, more preferably not more than 700,000, even more preferably not more than 400,000, and most preferably 300,000 or less.

The number average molecular weight and the weight average molecular weight can be measured by GPC using a calibration curve of standard polystyrenes. The GPC measurement conditions are the same as those described above in relation to the low-molecular weight components.

The aforementioned dispersity, number average molecular weight and weight average molecular weight values each indicate preferred ranges for the charge transport polymer 2, following removal of the low-molecular weight components from the charge transport polymer.

In the case of the weight average molecular weight, the values before and after removal of the low-molecular weight components may indicate a slight increase upon removal, but because there is no change in the molecular weight distribution at the high molecular weight side, no significant change is seen. In contrast, in the case of the number average molecular weight, the increase in the value upon removal of the low-molecular weight components is more apparent. In one preferred embodiment, the number average molecular weight before removal of the low-molecular weight components is less than 10,000, whereas the number average molecular weight after removal is 10,000 or greater.

(Degree of Polymerization)

The degree of polymerization of the charge transport polymer is preferably at least 5 but not more than 10,000, and is more preferably at least 10 but not more than 3,000. If this value of n is too small, then the film formation stability deteriorates, whereas if the value is too large, the solubility tends to deteriorate.

(Structure)

The charge transport polymer is a polymer that has the ability to transport an electric charge, and provided the proportion of low-molecular weight components has been reduced in the manner described above, there are no particular limitations on the structure of the polymer.

Specific examples of the polymer structure in preferred embodiments are described below.

The charge transport polymer may have a linear or branched structure. The charge transport polymer preferably contains at least a divalent structural unit L having charge transport properties and a monovalent structural unit T that forms the terminal portions, and may also contain a trivalent or higher structural unit B that forms a branched portion. The charge transport polymer may have only one type of each of these structural units, or may contain a plurality of types of each structural unit. In the charge transport polymer, the various structural units are bonded together at the "monovalent" to "trivalent or higher" bonding sites.

Examples of partial structures contained in the charge transport polymer are described below. However, the charge transport polymer is not limited to polymers having the following partial structures. In the partial structures, "L" represents a structural unit L, "B" represents a structural unit B, and "T" represents a structural unit T. In the present description, an "*" in a formula represents a bonding site for bonding to another structural unit. In the following partial structures, the plurality of L units may be units having the same structure or units having mutually different structures. This also applies for the B and T units.

Linear Charge Transport Polymer

T-L-L-L-L-* [Chemical formula 1]

Charge Transport Polymers Having Branched Structures

[Chemical formula 2]

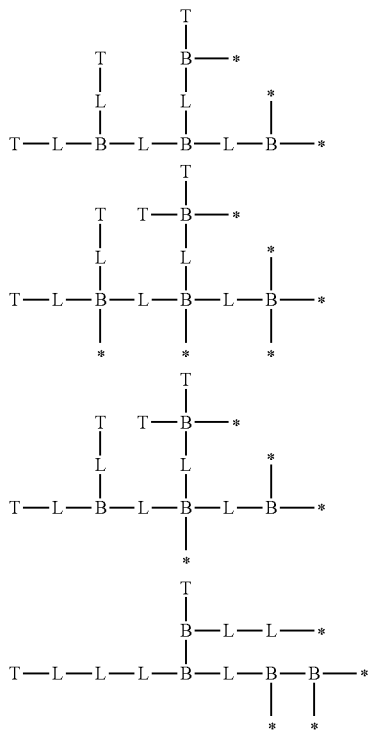

(Structural Unit L)

The structural unit L is a divalent structural unit having charge transport properties. There are no particular limitations on the structural unit L, provided it includes an atom grouping having the ability to transport an electric charge. For example, the structural unit L may be selected from among substituted or unsubstituted structures, including aromatic amine structures, carbazole structures, thiophene structures, fluorene structures, benzene structures, biphenyl structures, terphenyl structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, benzotriazole structures, and structures containing one, or two or more, of the above structures. The aromatic amine structures are preferably triarylamine structures, and more preferably triphenylamine structures.

In one embodiment, from the viewpoint of obtaining superior hole transport properties, the structural unit L is preferably selected from among substituted or unsubstituted structures including aromatic amine structures, carbazole structures, thiophene structures, fluorene structures, benzene structures, pyrrole structures, and structures containing one, or two or more, of these structures, and is more preferably selected from among substituted or unsubstituted structures including aromatic amine structures, carbazole structures, and structures containing one, or two or more, of these structures. In another embodiment, from the viewpoint of obtaining superior electron transport properties, the structural unit L is preferably selected from among substituted or unsubstituted structures including fluorene structures, benzene structures, phenanthrene structures, pyridine structures, quinoline structures, and structures containing one, or two or more, of these structures.

Specific examples of the structural unit L are shown below. However, the structural unit L is not limited to the following structures.

[Chemical formula 3]

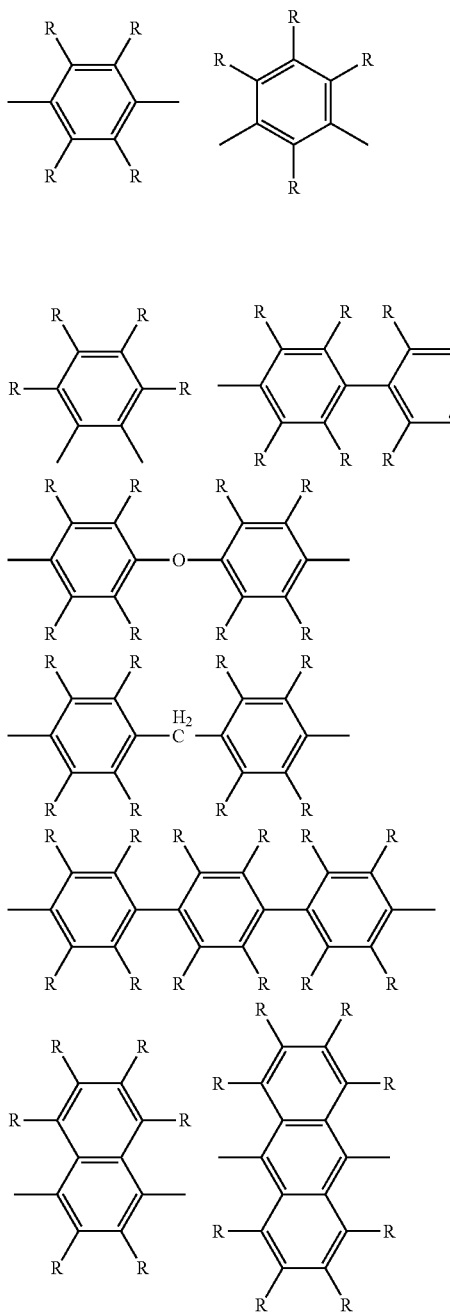
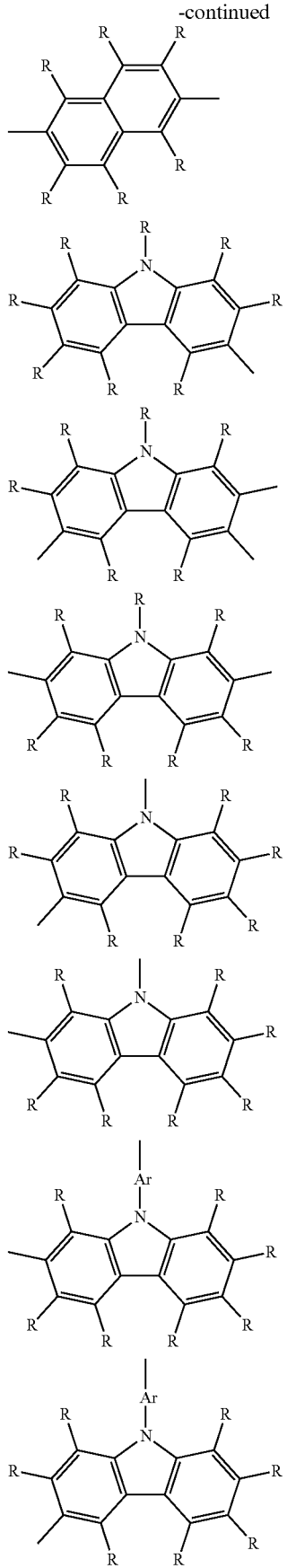

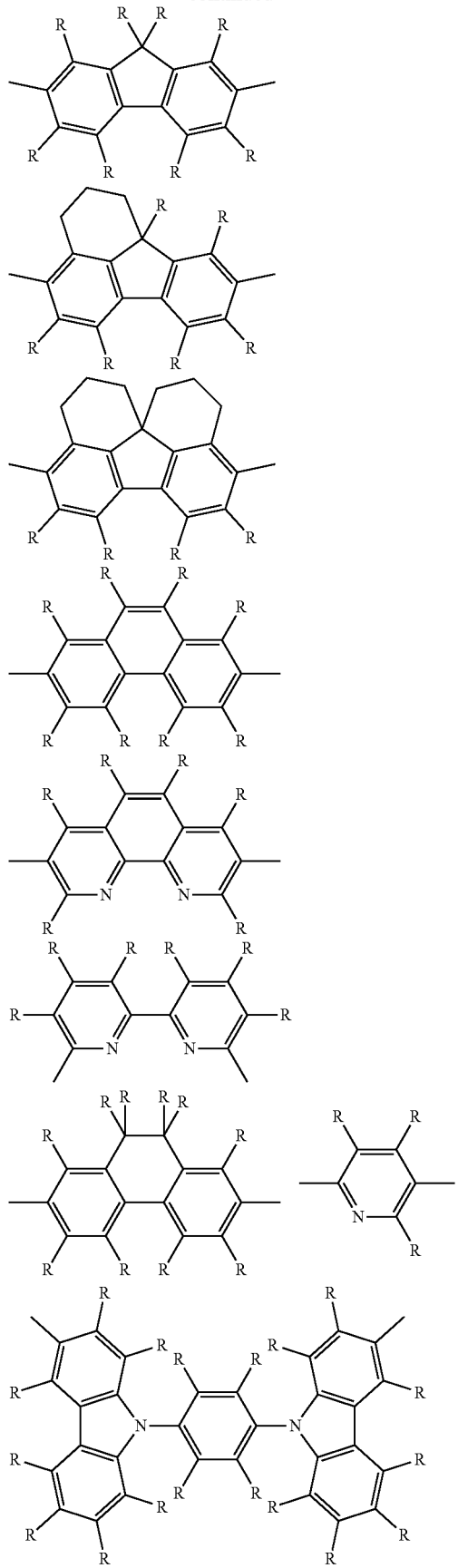
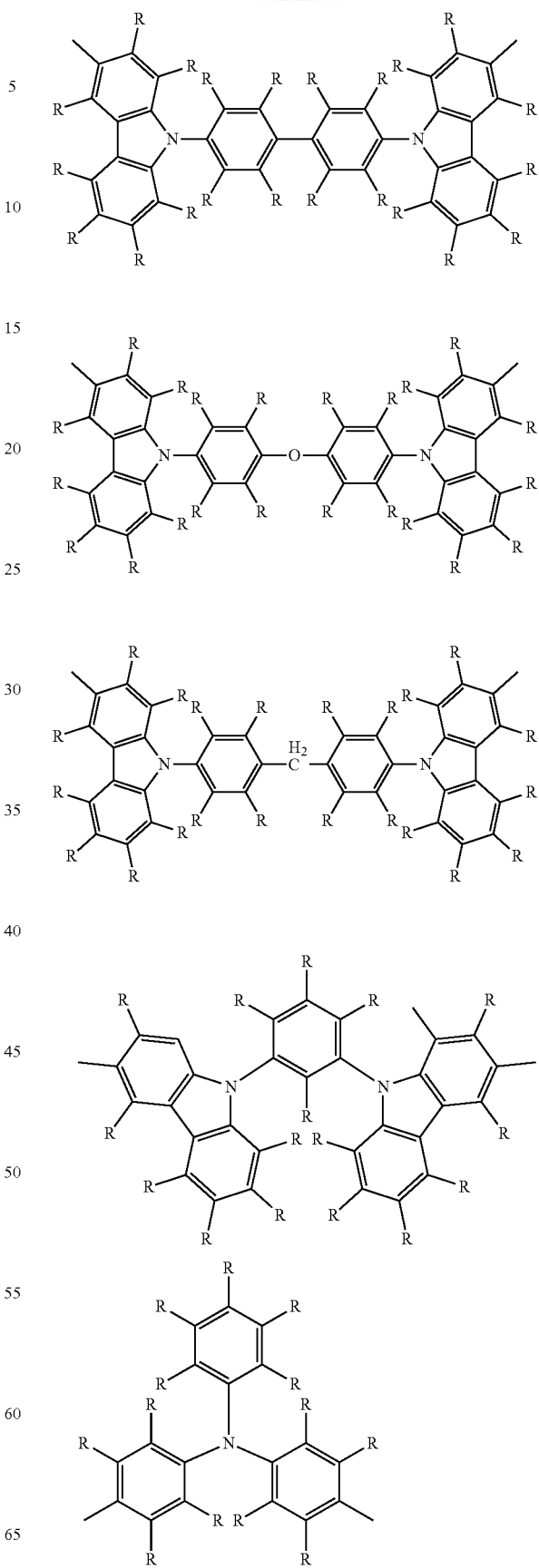

-continued
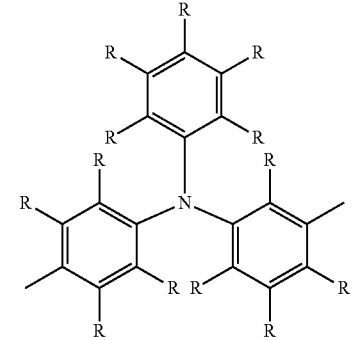
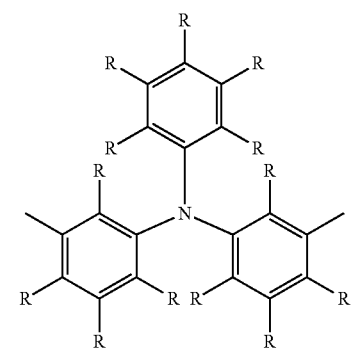
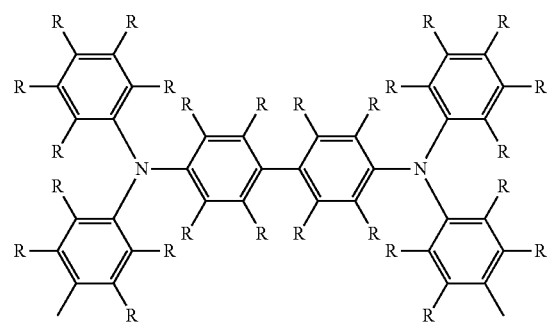
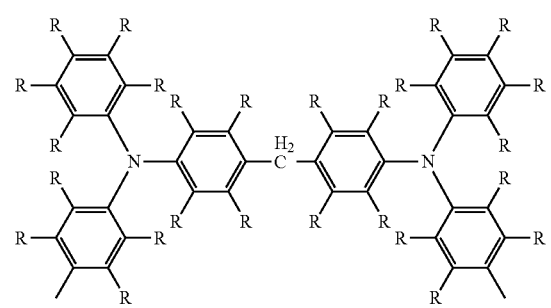
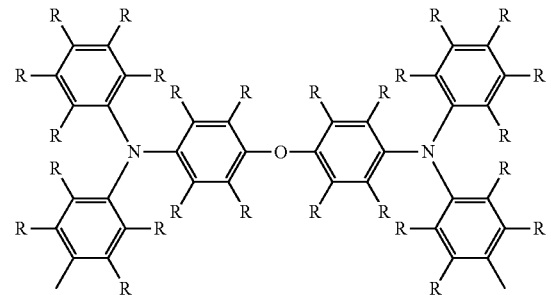
-continued
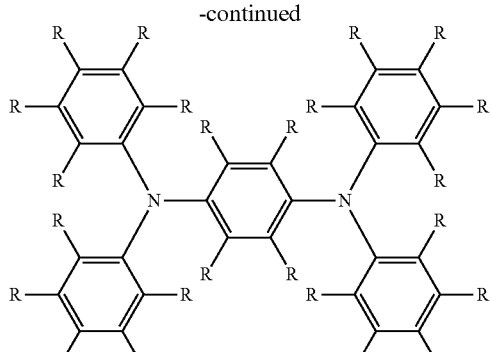
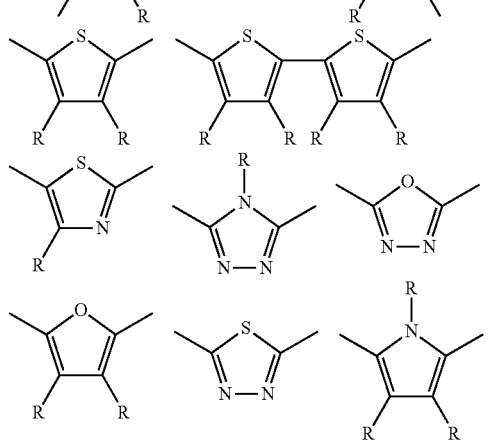
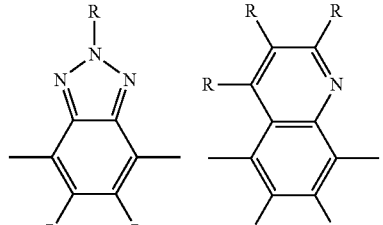
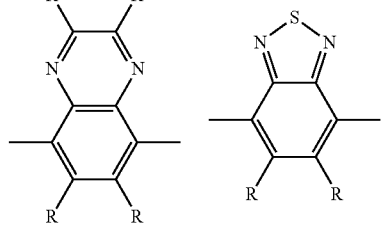
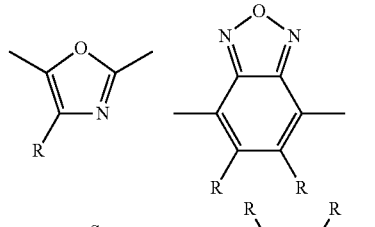
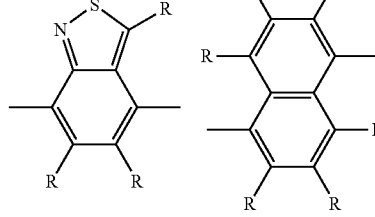

Each R independently represents a hydrogen atom or a substituent. It is preferable that each R is independently selected from the group consisting of —$R^1$, —$OR^2$, —$SR^3$, —$OCOR^4$, —$COOR^5$, —$SiR^6R^7R^8$, halogen atoms, and groups containing a polymerizable functional group described below. Each of $R^1$ to $R^8$ independently represents a hydrogen atom, a linear, cyclic or branched alkyl group of 1 to 22 carbon atoms, or an aryl group or heteroaryl group of 2 to 30 carbon atoms. An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an awl group or heteroaryl group of 2 to 20 carbon atoms, and the aryl group or heteroaryl group may be further substituted with a linear, cyclic or branched alkyl group of 1 to 22 carbon atoms. R is preferably a hydrogen atom, an alkyl group, an awl group, or an alkyl-substituted aryl group. Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

(Structural Unit T)

The structural unit T is a monovalent structural unit that constitutes a terminal portion of the charge transport polymer. There are no particular limitations on the structural unit T, which may be selected from among substituted or unsubstituted structures including aromatic hydrocarbon structures, aromatic heterocyclic structures, and structures containing one, or two or more, of these structures. In one embodiment, from the viewpoint of imparting durability without impairing the charge transport properties, the structural unit T is preferably a substituted or unsubstituted aromatic hydrocarbon structure, and is more preferably a substituted or unsubstituted benzene structure. Further, in another embodiment, when the charge transport polymer has a polymerizable functional group at a terminal portion in the manner described below, the structural unit T may be a polymerizable structure (for example, a polymerizable functional group such as a pyrrole-yl group). The structural unit T may have a similar structure to the structural unit L, or may have a different structure.

A specific example of the structural unit T is shown below. However, the structural unit T is not limited to the structure below.

[Chemical formula 5]

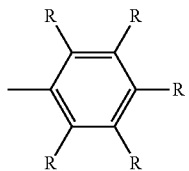

R is the same as R described in relation to the structural unit L. In those cases where the charge transport polymer has a polymerizable functional group described below at a terminal portion, it is preferable that at least one R is a group containing a polymerizable functional group.

(Structural Unit B)

The structural unit B is a trivalent or higher structural unit that constitutes a branched portion in those cases where the charge transport polymer has a branched structure. From the viewpoint of improving the durability of the organic electronic element, the structural unit B is preferably not higher than hexavalent, and is more preferably either trivalent or tetravalent. The structural unit B is preferably a unit that has charge transport properties. For example, from the viewpoint of improving the durability of the organic electronic element, the structural unit B is preferably selected from among substituted or unsubstituted structures including aromatic amine structures, carbazole structures, condensed polycyclic aromatic hydrocarbon structures, and structures containing one, or two or more, of these structures. The structural unit B may have a similar structure to the structural unit L or a different structure, and may have a similar structure to the structural unit T or a different structure.

Specific examples of the structural unit B are shown below. However, the structural unit B is not limited to the following structures.

[Chemical formula 6]

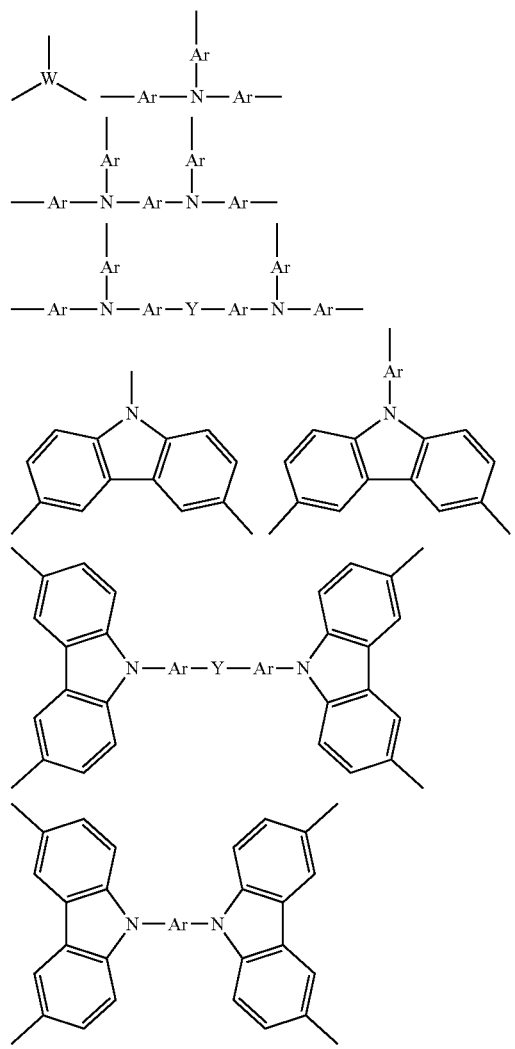

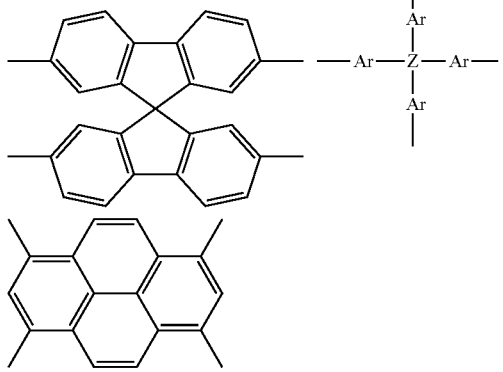

W represents a trivalent linking group, and for example, represents an arenetriyl group or heteroarenetriyl group of 2 to 30 carbon atoms. In a similar manner as above, an arenetriyl group is an atom grouping in which three hydrogen atoms have been removed from an aromatic hydrocarbon. A heteroarenetriyl is an atom grouping in which three hydrogen atoms have been removed from an aromatic heterocycle. Each Ar independently represents a divalent linking group, and for example, may represent independently an arylene group or heteroarylene group of 2 to 30 carbon atoms. Ar preferably represents an arylene group, and more preferably a phenylene group. Y represents a divalent linking group, and examples include divalent groups in which an additional hydrogen atom has been removed from any of the R groups having one or more hydrogen atoms (but excluding groups containing a polymerizable functional group) described in relation to the structural unit L. Z represents a carbon atom, a silicon atom or a phosphorus atom. In the structural units, the benzene rings and Ar groups may have a substituent, and examples of the substituent include the R groups in the structural unit L.

(Polymerizable Functional Group)

In one embodiment, from the viewpoint of enabling the polymer to be cured by a polymerization reaction, thereby changing the solubility in solvents, the charge transport polymer preferably has at least one polymerizable functional group (also referred to as a "polymerizable substituent"). A "polymerizable functional group" is a group which is able to form bonds upon the application of heat and/or light.

Examples of the polymerizable functional group include groups having a carbon-carbon multiple bond (such as a vinyl group, allyl group, butenyl group, ethynyl group, acryloyl group, acryloyloxy group, acryloylamino group, methacryloyl group, methacryloyloxy group, methacryloylamino group, vinyloxy group and vinylamino group), groups having a small ring (including cyclic alkyl groups such as a cyclopropyl group and cyclobutyl group; cyclic ether groups such as an epoxy group (oxiranyl group) and oxetane group (oxetanyl group); diketene groups; episulfide groups; lactone groups; lactam groups; and heterocyclic groups (such as a furan-yl group, pyrrole-yl group, thiophene-yl group and silole-yl group). Particularly preferred polymerizable functional groups include a vinyl group, acryloyl group, methacryloyl group, epoxy group and oxetane group. From the viewpoint of improving the reactivity and the characteristics of the organic electronic element, a vinyl group, oxetane group or epoxy group is more preferred, and an oxetane group is the most desirable.

From the viewpoints of increasing the degree of freedom associated with the polymerizable functional group and facilitating the polymerization reaction, the main backbone of the charge transport polymer and the polymerizable functional group are preferably linked, for example, via a linear alkylene group of 1 to 8 carbon atoms. Further, in the case where, for example, the organic layer is to be formed on an electrode, from the viewpoint of enhancing the affinity with hydrophilic electrodes of ITO or the like, the main backbone and the polymerizable functional group are preferably linked via a hydrophilic chain such as an ethylene glycol chain or a diethylene glycol chain. Moreover, from the viewpoint of simplifying preparation of the monomer used for introducing the polymerizable functional group, the charge transport polymer may have an ether linkage or an ester linkage at the terminal of the alkylene chain and/or the hydrophilic chain, namely, at the linkage site between these chains and the polymerizable functional group, and/or at the linkage site between these chains and the charge transport polymer backbone. The aforementioned "group containing a polymerizable functional group" means a polymerizable functional group itself, or a group composed of a combination of a polymerizable functional group and an alkylene chain or the like. Examples of groups that can be used favorably as this group containing a polymerizable functional group include the groups exemplified in WO 2010/140553.

The polymerizable functional group may be introduced at a terminal portion of the charge transport polymer (namely, a structural unit T), at a portion other than a terminal (namely, a structural unit L or B), or at both a terminal portion and a portion other than a terminal. From the viewpoint of the curability, the polymerizable functional group is preferably introduced at least at a terminal portion, and from the viewpoint of achieving a combination of favorable curability and charge transport properties, is preferably introduced only at terminal portions. Further, in those cases where the charge transport polymer has a branched structure, the polymerizable functional group may be introduced within the main chain of the charge transport polymer, within a side chain, or within both the main chain and side chain.

From the viewpoint of contributing to a change in the solubility, the polymerizable functional group is preferably included in the charge transport polymer in a large amount. On the other hand, from the viewpoint of not impeding the charge transport properties, the amount included in the charge transport polymer is preferably kept small. The amount of the polymerizable functional group may be set as appropriate with due consideration of these factors.

For example, from the viewpoint of obtaining a satisfactory change in the solubility, the number of polymerizable functional groups per one molecule of the charge transport polymer is preferably at least 2, and more preferably 3 or greater. Further, from the viewpoint of maintaining good charge transport properties, the number of polymerizable functional groups is preferably not more than 1,000, and more preferably 500 or fewer.

The number of polymerizable functional groups per one molecule of the charge transport polymer can be determined as an average value from the amount of the polymerizable functional group used in synthesizing the charge transport polymer (for example, the amount added of the monomer having the polymerizable functional group), the amounts added of the monomers corresponding with the various structural units, and the weight average molecular weight of the charge transport polymer and the like. Further, the number of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer, and the weight average molecular weight of the charge transport polymer and the like. In terms of ease of calculation, if the amounts added of the various components are clear, then the number of polymerizable functional groups is preferably determined from these amounts added.

(Proportions of Structural Units)

From the viewpoint of ensuring satisfactory charge transport properties, the proportion of the structural unit L contained in the charge transport polymer, relative to the total of all the structural units, is preferably at least 10 mol %, more preferably at least 20 mol %, and even more preferably 30 mol % or higher. If the structural unit T and the optionally included structural unit B are taken into consideration, then the proportion of the structural unit L is preferably not more than 95 mol %, more preferably not more than 90 mol %, and even more preferably 85 mol % or less.

From the viewpoint of improving the characteristics of the organic electronic element, or from the viewpoint of suppressing any increase in viscosity and enabling more favorable synthesis of the charge transport polymer, the proportion of the structural unit T contained in the charge transport polymer, relative to the total of all the structural units, is preferably at least 5 mol %, more preferably at least 10 mol %, and even more preferably 15 mol % or higher. Further, from the viewpoint of ensuring satisfactory charge transport properties, the proportion of the structural unit T is preferably not more than 60 mol %, more preferably not more than 55 mol %, and even more preferably 50 mol % or less.

In those cases where the charge transport polymer includes a structural unit B, from the viewpoint of improving the durability of the organic electronic element, the proportion of the structural unit B, relative to the total of all the structural units, is preferably at least 1 mol %, more preferably at least 5 mol %, and even more preferably 10 mol % or higher. Further, from the viewpoints of suppressing any increase in viscosity and enabling more favorable synthesis of the charge transport polymer, or from the viewpoint of ensuring satisfactory charge transport properties, the proportion of the structural unit B is preferably not more than 50 mol %, more preferably not more than 40 mol %, and even more preferably 30 mol % or less.

In those cases where the charge transport polymer has a polymerizable functional group, from the viewpoint of ensuring efficient curing of the charge transport polymer, the proportion of the polymerizable functional group, relative to the total of all the structural units, is preferably at least 0.1 mol %, more preferably at least 1 mol %, and even more preferably 3 mol % or higher. Further, from the viewpoint of ensuring favorable charge transport properties, the proportion of the polymerizable functional group is preferably not more than 70 mol %, more preferably not more than 60 mol %, and even more preferably 50 mol % or less. Here, the "proportion of the polymerizable functional group" refers to the proportion of structural units having the polymerizable functional group.

Considering the balance between the charge transport properties, the durability and the productivity, the ratio (molar ratio) between the structural unit L and the structural unit T is preferably L:T=100:(1 to 70), more preferably 100:(3 to 50), and even more preferably 100:(5 to 30). Further, in those cases where the charge transport polymer includes the structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

The proportion of each structural unit can be determined from the amount added of the monomer corresponding with that structural unit during synthesis of the charge transport polymer. Further, the proportion of each structural unit can also be calculated as an average value using the integral of the spectrum attributable to the structural unit in the $^1$H-NMR spectrum of the charge transport polymer. In terms of ease of calculation, if the amount added of the monomer is clear, then the proportion of the structural unit preferably uses the value determined using the amount added of the monomer.

In a particularly preferred embodiment, from the viewpoints of achieving superior hole injection properties and hole transport properties and the like, the charge transport polymer is preferably a compound containing a structural unit having an aromatic amine structure and/or a structural unit having a carbazole structure as the main structural unit (main backbone). Further, from the viewpoint of facilitating easier multilayering, the charge transport polymer is preferably a compound having at least 2 or more polymerizable substituents. In terms of providing superior curability, the polymerizable substituents are preferably groups having a cyclic ether structure or groups having a carbon-carbon multiple bond or the like.

(Production Method)

The charge transport polymer of an embodiment of the present invention is preferably a polymer or copolymer of a monomer containing a structural unit having hole transport properties. The charge transport polymer can be produced favorably by copolymerizing a monomer mixture containing one or more monomers containing the structural unit L and one or more monomers containing the structural unit T, and optionally containing a monomer containing the structural unit B. The copolymer may be an alternating, random, block or graft copolymer, or a copolymer having an intermediate type structure, such as a random copolymer having block-like properties.

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made to WO 2010/140553 in relation to synthesis methods for the charge transport polymer.

Following synthesis of the polymer, the charge transport polymer 2 can be obtained by removing the prescribed low-molecular weight components by a suitable method, and a charge transport polymer 1 having a small amount of low-molecular weight components can also be obtained easily by removing low-molecular weight components.

[Dopant]

The organic electronic material may include optional additives, and for example, may include a dopant. There are no particular limitations on the dopant, provided a doping effect is achieved by adding the dopant to the organic electronic material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant. To improve the hole transport properties, p-type doping is preferably performed, whereas to improve the electron transport properties, n-type doping is preferably performed. The dopant used in the organic electronic material may be a dopant that exhibits either a p-type doping effect or an n-type doping effect. Further, a single dopant may be added, or a mixture of a plurality of dopants may be added.

The dopants used in p-type doping are electron-accepting compounds, and examples include Lewis acids, protonic acids, transition metal compounds, ionic compounds, halides and n-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_5$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halides such as $Cl_2$, $Br_2$, $I_2$, ICl, $ICl_3$, IBr and IF; and n-conjugated compounds such as TCNE (tetracyanoethylene) and TCNQ (tetracyanoquinodimethane). Further, the electron-accepting compounds disclosed in JP 2000-36390 A, JP 2005-75948 A, and JP 2003-213002 A and the like can also be used. Lewis acids, ionic compounds, and n-conjugated compounds and the like are preferred.

The dopants used in n-type doping are electron-donating compounds, and examples include alkali metals such as Li and Cs; alkaline earth metals such as Mg and Ca; salts of alkali metals and/or alkaline earth metals such as LiF and $Cs_2CO_3$; metal complexes; and electron-donating organic compounds.

In those cases where the charge transport polymer has a polymerizable functional group, in order to facilitate a change in the solubility of the organic layer, the use of a compound that can function as a polymerization initiator for the polymerizable functional group as the dopant is preferred.

[Other Optional Components]

The organic electronic material may also contain charge transport low-molecular weight compounds, or other polymers or the like.

[Contents]

From the viewpoint of obtaining favorable charge transport properties, the amount of the charge transport polymer in the organic electronic material, relative to the total mass of the organic electronic material, is preferably at least 50% by mass, more preferably at least 70% by mass, and even more preferably 80% by mass or greater. There are no particular limitations on the upper limit for the amount of the charge transport polymer, and the amount may be 100% by mass. If consideration is given to the inclusion of additives such as dopants, then the amount of the charge transport polymer is typically not more than 95% by mass, or not more than 90% by mass or the like.

When a dopant is included, from the viewpoint of improving the charge transport properties of the organic electronic material, the amount of the dopant relative to the total mass of the organic electronic material is preferably at least 0.01% by mass, more preferably at least 0.1% by mass, and even more preferably 0.5% by mass or greater. Further, form the viewpoint of maintaining favorable film formability, the amount of the dopant relative to the total mass of the organic electronic material is preferably not more than 50% by mass, more preferably not more than 30% by mass, and even more preferably 20% by mass or less.

<Method for Producing Organic Electronic Material>

A method for producing an organic electronic material according to an embodiment of the present invention is a method for producing an organic electronic material containing a charge transport polymer for which, in a molecular weight distribution chart measured by GPC, the area ratio accounted for by components having a molecular weight of less than 20,000 is not more than 40%, wherein the method includes a step of removing components having a molecular weight of less than 20,000 from the charge transport polymer.

The term "removing" has the same meaning as that described in relation to the charge transport polymer. Further, the preferred structure, number average molecular weight, weight average molecular weight and dispersity for the produced charge transport polymer are as described above.

In one preferred embodiment, the method for producing an organic electronic material containing a charge transport polymer includes a step of preparing the charge transport polymer, and a step of removing components having a molecular weight of less than 20,000 from the charge transport polymer, thereby obtaining a charge transport polymer for which, in a molecular weight distribution chart measured by GPC, the area ratio accounted for by components having a molecular weight of less than 20,000 is not more than 40%.

In the above preferred embodiment, in the case where a charge transport polymer synthesized by a typical polymerization or copolymerization contains low-molecular weight components in an amount greater than a GPC chart area ratio of 40%, the method includes a step of reducing the amount of those low-molecular weight components to an area ratio of 40% or less.

<Ink Composition>

An ink composition according to one embodiment of the present invention contains the organic electronic material of the embodiment described above (including an organic electronic material obtained using the method for producing an organic electronic material of the above embodiment, this also applies in the following description), and a solvent capable of dissolving or dispersing the material. By using an ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol;

alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride. Preferred solvents include aromatic hydrocarbons, aliphatic esters, aromatic esters, aliphatic ethers, and aromatic ethers and the like.

[Polymerization Initiator]

In those cases where the charge transport polymer has a polymerizable functional group, the ink composition preferably contains a polymerization initiator. Conventional radical polymerization initiators, cationic polymerization initiators, and anionic polymerization initiators and the like can be used as the polymerization initiator. From the viewpoint of enabling simple preparation of the ink composition, the use of a substance that exhibits both a function as a dopant and a function as a polymerization initiator is preferred. Examples of such substances include the ionic compounds described above.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various application methods. For example, the amount of the solvent is preferably an amount that yields a ratio of the charge transport polymer relative to the solvent that is at least 0.1% by mass, more preferably at least 0.2% by mass, and even more preferably 0.5% by mass or greater. Further, the amount of the solvent is preferably an amount that yields a ratio of the charge transport polymer relative to the solvent that is not more than 20% by mass, more preferably not more than 15% by mass, and even more preferably 10% by mass or less.

<Organic Layer>

An organic layer according to an embodiment of the present invention is a layer formed using the organic electronic material or the ink composition of the embodiments described above. By using the ink composition, an organic layer can be formed favorably and easily by a coating method. Examples of the coating method include spin coating methods, casting methods, dipping methods, plate-based printing methods such as relief printing, intaglio printing, offset printing, lithographic printing, relief reversal offset printing, screen printing and gravure printing, and plateless printing methods such as inkjet methods. When the organic layer is formed by a coating method, the organic layer (coating layer) obtained following coating may be dried on a hotplate or in an oven to remove the solvent.

In those cases where the charge transport polymer has a polymerizable functional group, the charge transport polymer can be subjected to a polymerization reaction by performing light irradiation or a heat treatment or the like, thereby changing the solubility of the organic layer. By stacking organic layers having changed solubility levels, multilayering of an organic electronic element can be performed with ease. Reference may also be made to WO 2010/140553 in relation to the method used for forming the organic layer.

From the viewpoint of improving the efficiency of charge transport, the thickness of the organic layer obtained following drying or curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

<Organic Electronic Element>

An organic electronic element according to an embodiment of the present invention has at least one or more of the organic layers of the embodiment described above. Examples of the organic electronic element include an organic EL element, an organic photoelectric conversion element, and an organic transistor. The organic electronic element preferably has at least a structure in which an organic layer is disposed between a pair of electrodes.

<Organic EL Element>

An organic EL element according to an embodiment of the present invention has at least one or more of the organic layers of the embodiment described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. The organic EL element preferably has the aforementioned organic layer as the light-emitting layer or as another functional layer, more preferably has the organic layer as a functional layer, and most preferably has the organic layer as at least one of a hole injection layer and a hole transport layer.

FIG. 1 is a cross-sectional schematic view illustrating one embodiment of the organic EL element. The organic EL element in FIG. 1 is an element with a multilayer structure, and has a substrate 8, an anode 2, a hole injection layer 3, a hole transport layer 6, a light-emitting layer 1, an electron transport layer 7, an electron injection layer 5 and a cathode 4 provided in that order. Each of these layers is described below.

[Light-Emitting Layer]

Examples of the materials that can be used for the light-emitting layer include low-molecular weight compounds, polymers, and dendrimers and the like. Polymers exhibit good solubility in solvents, meaning they are suitable for coating methods, and are consequently preferred. Examples of the light-emitting material include luminescent materials, phosphorescent materials, and thermally activated delayed fluorescent materials (TADF).

Specific examples of the luminescent materials include low-molecular weight compounds such as perylene, coumarin, rubrene, quinacridone, stilbene, color laser dyes, aluminum complexes, and derivatives of these compounds; polymers such as polyfluorene, polyphenylene, polyphenylenevinylene, polyvinylcarbazole, fluorene-benzothiadiazole copolymers, fluorene-triphenylamine copolymers, and derivatives of these compounds; and mixtures of the above materials.

Examples of materials that can be used as the phosphorescent materials include meal complexes and the like containing a metal such as Ir or Pt or the like. Specific examples of Ir complexes include FIr(pic) (iridium(III) bis[(4,6-difluorophenyl)-pyridinato-N,$C^2$]picolinate) which emits blue light, Ir(ppy)$_3$ (fac-tris(2-phenylpyridine)iridium) which emits green light, and (btp)$_2$Ir(acac) (bis[2-(2'-benzo[4,5-a]thienyl)pyridinato-N,$C^3$]iridium(acetyl-acetonate)) and Ir(piq)$_3$ (tris(1-phenylisoqionoline)iridium) which emit red light. Specific examples of Pt complexes include PtOEP (2,3,7,8,12,13,17,18-octaethyl-21H,23H-porphyrin-platinum) which emits red light.

When the light-emitting layer contains a phosphorescent material, a host material is preferably also included in addition to the phosphorescent material. Low-molecular weight compounds, polymers, and dendrimers can be used as this host material. Examples of the low-molecular weight compounds include CBP (4,4'-bis(9H-carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds, whereas examples of the polymers include the organic electronic material of the aforementioned embodiment, polyvinylcarbazole, polyphenylene, polyfluorene, and derivatives of these polymers.

Examples of the thermally activated delayed fluorescent materials include the compounds disclosed in Adv. Mater., 21, 4802-4906 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Lett., 43, 319 (2014) and the like.

[Hole Injection Layer, Hole Transport Layer]

The organic layer formed using the organic electronic material described above is preferably used as at least one of a hole injection layer and a hole transport layer, and is more preferably used as at least a hole transport layer. As described above, by using an ink composition containing the organic electronic material, these types of layers can be formed with ease.

The organic EL element may have a structure in which the organic layer formed using the organic electronic material described above is used as a hole transport layer, and if the element also has a hole injection layer, then a conventional material may be used for the hole injection layer. Further, the organic EL element may also have a structure in which the organic layer formed using the organic electronic material described above is used as a hole injection layer, and if the element also has a hole transport layer, then a conventional material may be used for the hole transport layer.

Examples of materials that can be used for the hole injection layer and the hole transport layer include aromatic amine-based compounds (for example, aromatic diamines such as N,N'-di(naphthalen-1-yl)-N,N'-diphenyl-benzidine (α-NPD)), phthalocyanine-based compounds, and thiophene-based compounds (for example, thiophene-based conductive polymers (such as poly(3,4-ethylenedioxythiophene):poly(4-styrenesulfonate) (PEDOT:PSS) and the like).

[Electron Transport Layer, Electron Injection Layer]

Examples of materials that can be used for the electron transport layer and the electron injection layer include phenanthroline derivatives, bipyridine derivatives, nitro-substituted fluorene derivatives, diphenylquinone derivatives, thiopyran dioxide derivatives, tetracarboxylic acid anhydrides of condensed-ring compound such as naphthalene and perylene and the like, carbodiimides, fluorenylidenemethane derivatives, anthraquinodimethane and anthrone derivatives, oxadiazole derivatives, thiadiazole derivatives, benzimidazole derivatives, quinoxaline derivatives, and aluminum complexes. Further, the organic electronic material of the embodiment described above may also be used.

[Cathode]

Examples of the cathode material include metals or metal alloys, such as Li, Ca, Mg, Al, In, Cs, Ba, Mg/Ag, LiF and CsF.

[Anode]

Metals (for example, Au) or other materials having conductivity can be used as the anode. Examples of the other materials include oxides (for example, ITO: indium oxide/tin oxide), and conductive polymers (for example, polythiophene-polystyrene sulfonate mixtures (PEDOT:PSS)).

[Substrate]

Glass and plastics and the like can be used as the substrate. The substrate is preferably transparent, and a flexible substrate having flexibility is preferred. Quartz glass and light-transmitting resin films and the like can be used favorably.

Examples of the resin films include films composed of polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Encapsulation]

The organic EL element may be encapsulated to reduce the effect of the outside atmosphere and extend the life of the element. Materials that can be used for the encapsulation include, but are not limited to, glass, plastic films such as epoxy resins, acrylic resins, polyethylene terephthalate and polyethylene naphthalate, and inorganic substances such as silicon oxide and silicon nitride.

There are no particular limitations on the encapsulation method, and conventional methods may be used.

[Emission Color]

There are no particular limitations on the color of the light emission from the organic EL element. White organic EL elements can be used for various lighting equipment, including domestic lighting, in-vehicle lighting, watches and liquid crystal backlights, and are consequently preferred.

The method used for forming a white organic EL element involves using a plurality of light-emitting materials to emit a plurality of colors simultaneously, and then mixing the emitted colors to obtain a white light emission. There are no particular limitations on the combination of the plurality of emission colors, and examples include combinations that include three maximum emission wavelengths for blue, green and red, and combinations that include two maximum emission wavelengths for blue and yellow, or yellowish green and orange. Control of the emission color can be achieved by appropriate adjustment of the types and amounts of the light-emitting materials.

[Display Element, Illumination Device, Display Device]

A display element according to an embodiment of the present invention contains the organic EL element of the embodiment described above. For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Further, an illumination device according to an embodiment of the present invention contains the organic EL element of an embodiment of the present invention. Moreover, a display device according to an embodiment of the present invention contains the illumination device and a liquid crystal element as a display means. For example, the display device may be a device that uses the illumination device according to an embodiment of the present invention as a backlight, and uses a conventional liquid crystal element as the display unit, namely a liquid crystal display device.

EXAMPLES

The present invention is described below in further detail using a series of examples, but the present invention is not limited by the following examples. Unless specifically stated otherwise, "%" means "% by mass". Further, in the following examples, the monomers that form the aforementioned structural unit L, structural unit B and structural unit T may be referred to as an "L monomer", "B monomer" and "T monomer" respectively, and in order to distinguish between a plurality of the same type of monomer, terms such as "T1 monomer" and "T2 monomer" may be used.

<Preparation of Pd Catalyst>

In a glove box under a nitrogen atmosphere and at room temperature, tris(dibenzylideneacetone)dipalladium (73.2 mg, 80 μmol) was weighed into a sample tube, anisole (15 ml) was added, and the resulting mixture was agitated for 30 minutes. In a similar manner, tris(t-butyl)phosphine (129.6 mg, 640 μmol) was weighed into a sample tube, anisole (5 ml) was added, and the resulting mixture was agitated for 5 minutes. The two solutions were then mixed together and stirred for 30 minutes at room temperature to obtain a catalyst solution. All the solvents used in the catalyst preparation were deaerated by nitrogen bubbling for at least 30 minutes prior to use.

<Synthesis of Charge Transport Polymer 1-1>

A three-neck round-bottom flask was charged with a monomer 2 shown below (4.0 mmol) as an L monomer, a monomer 3 shown below (5.0 mmol) as a B monomer, a monomer 1 shown below (0.1 mmol) as a first T monomer (T1 monomer), a monomer 4 shown below (1.9 mmol) as a second T monomer (T2 monomer), and anisole (20 mL), and the prepared Pd catalyst solution (7.5 mL) was then added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use.

[Chemical formula 7]

Monomer 1

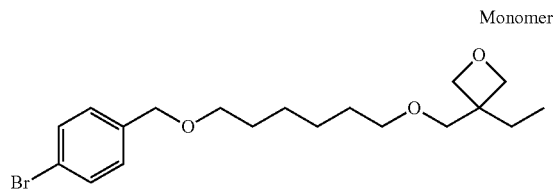

Monomer 2

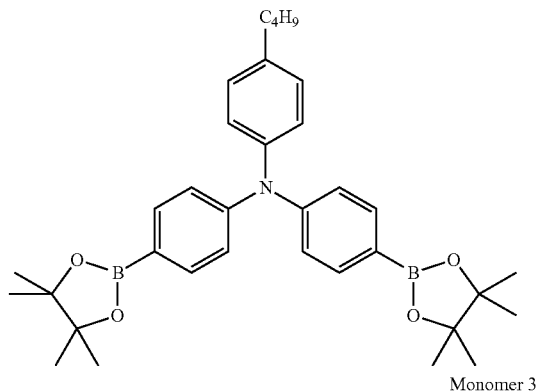

Monomer 3

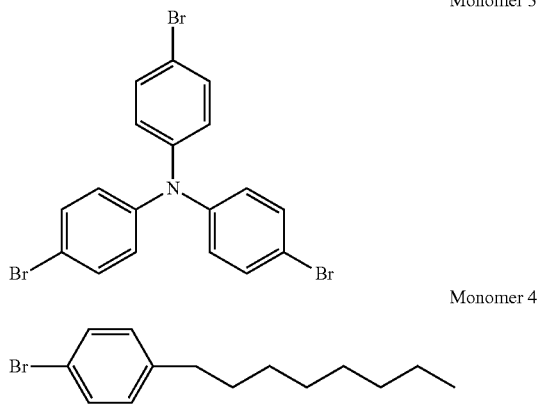

Monomer 4

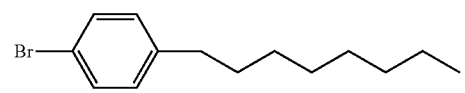

After completion of the reaction, the organic layer was washed with water, and the organic layer was then poured into methanol-water (9:1). The resulting precipitate was collected by filtration, and washed with methanol-water (9:1). The washed precipitate was dissolved in toluene, and re-precipitated from methanol. The resulting precipitate was dried thoroughly and then dissolved in toluene to form a 10% polymer solution. A scavenger ("Triphenylphosphine, polymer-bound on styrene-divinylbenzene copolymer", manufactured by Strem Chemicals Inc.) was added to the solution in a mass equal to the mass of the polymer, and the resulting mixture was stirred at room temperature for at least 5 hours. Subsequently, the scavenger was removed by filtration through a polytetrafluoroethylene filter having a pore size of 0.2 μm (DISMIC 25JP020AN), and the filtrate was mixed with methanol to re-precipitate the polymer. The polymer was collected by filtration and dried under vacuum in a desiccator to obtain a charge transport polymer 1-1 from which low-molecular weight components had not been removed.

<Syntheses of Charge Transport Polymers 1-2 to 1-5>

Using the same procedure as that described above for the charge transport polymer 1-1, a charge transport polymer 1-2, a charge transport polymer 1-3, a charge transport polymer 1-4 and a charge transport polymer 1-5 were synthesized. The chemical formulas of the monomers used in the various syntheses are shown below, and the combinations of those monomers are shown below in Table 1. The monomers for the aforementioned charge transport polymer 1-1, and charge transport polymers 1-6 and 1-7 described below are also shown in Table 1.

[Chemical formula 8]

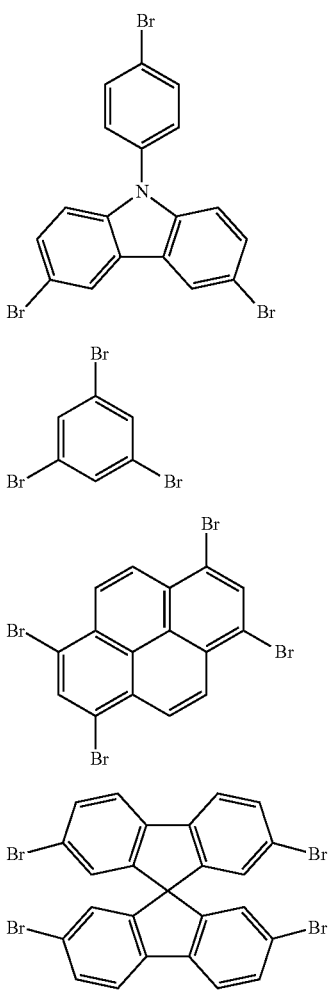

Monomer 5

Monomer 6

Monomer 7

Monomer 8

TABLE 1

| Charge transport polymer | L monomer | B monomer | T1 monomer | T2 monomer |
|---|---|---|---|---|
| Charge transport polymer 1-1 | Monomer 2 | Monomer 3 | Monomer 1 | Monomer 4 |
| Charge transport polymer 1-2 | Monomer 2 | Monomer 5 | Monomer 1 | Monomer 4 |
| Charge transport polymer 1-3 | Monomer 2 | Monomer 6 | Monomer 1 | Monomer 4 |
| Charge transport polymer 1-4 | Monomer 2 | Monomer 7 | Monomer 1 | Monomer 4 |
| Charge transport polymer 1-5 | Monomer 2 | Monomer 8 | Monomer 1 | Monomer 4 |
| Charge transport polymer 1-6 | Monomer 2 | Monomer 3 | Monomer 1 | — |
| Charge transport polymer 1-7 | Monomer 2 | Monomer 5 | Monomer 1 | — |

<Synthesis of Charge Transport Polymer 1-6>

With the exception of using 2.0 mmol of the aforementioned monomer 1 alone as the T monomer, a charge transport polymer 1-6 from which low-molecular weight components had not been removed was obtained in the same manner as that described for the charge transport polymer 1-1.

<Synthesis of Charge Transport Polymer 1-7>

With the exception of using the monomer 5 instead of the monomer 3 as the B monomer, a charge transport polymer 1-7 from which low-molecular weight components had not been removed was obtained in the same manner as the above charge transport polymer 1-6.

<Synthesis of Charge Transport Polymer 2-1>

In the same manner as that described above for the charge transport polymer 1-1, a three-neck round-bottom flask was charged with the monomer 2 (4.0 mmol) as an L monomer, the monomer 3 (5.0 mmol) as a B monomer, the monomer 1 (0.1 mmol) as a first T monomer (T1 monomer), and the monomer 4 (1.9 mmol) as a second T monomer (T2 monomer), and then anisole (20 mL) and the prepared Pd catalyst solution (7.5 mL) was added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use.

After completion of the reaction, the organic layer was washed with water, and the organic layer was then poured into methanol-water (9:1). The resulting precipitate was collected by filtration, dried under vacuum, subsequently stirred at 60° C. for 30 minutes in a mixed solution of ethyl acetate and toluene (1:1) (using 50 mL of the mixed solution per 1.5 g of the precipitate), and then hot-filtered to remove low-molecular weight components from the polymer. The same operation was repeated 3 times, and the polymer was then dried thoroughly and dissolved in toluene to obtain a 10% polymer solution.

Thereafter, the operation using a scavenger and the re-precipitation from methanol were performed in the same manner as that described above for the charge transport polymer 1-1, thus obtaining a charge transport polymer 2-1 from which low-molecular weight components had been removed.

<Syntheses of Charge Transport Polymers 2-2 to 2-5>

Using the same procedure as that described above for the charge transport polymer 2-1, a charge transport polymer 2-2, a charge transport polymer 2-3, a charge transport polymer 2-4 and a charge transport polymer 2-5 were synthesized. The combinations of monomers used in the various syntheses are shown in Table 2. The monomers for the aforementioned charge transport polymer 2-1, and charge transport polymers 2-6 and 2-7 described below are also shown in Table 2.

TABLE 2

| Charge transport polymer | L monomer | B monomer | T1 monomer | T2 monomer |
|---|---|---|---|---|
| Charge transport polymer 2-1 | Monomer 2 | Monomer 3 | Monomer 1 | Monomer 4 |
| Charge transport polymer 2-2 | Monomer 2 | Monomer 5 | Monomer 1 | Monomer 4 |
| Charge transport polymer 2-3 | Monomer 2 | Monomer 6 | Monomer 1 | Monomer 4 |
| Charge transport polymer 2-4 | Monomer 2 | Monomer 7 | Monomer 1 | Monomer 4 |
| Charge transport polymer 2-5 | Monomer 2 | Monomer 8 | Monomer 1 | Monomer 4 |
| Charge transport polymer 2-6 | Monomer 2 | Monomer 3 | Monomer 1 | — |
| Charge transport polymer 2-7 | Monomer 2 | Monomer 5 | Monomer 1 | — |

<Synthesis of Charge Transport Polymer 2-6>

With the exception of using 2.0 mmol of the aforementioned monomer 1 alone as the T monomer, a charge transport polymer 2-6 from which low-molecular weight components had been removed was obtained in the same manner as that described for the charge transport polymer 2-1.

<Synthesis of Charge Transport Polymer 2-7>

With the exception of using the monomer 5 instead of the monomer 3 as the B monomer, a charge transport polymer 2-7 from which low-molecular weight components had been removed was obtained in the same manner as the above charge transport polymer 2-6.

<Synthesis of Charge Transport Polymer 3-1>

A three-neck round-bottom flask was charged with the monomer 2 (4.0 mmol) as an L monomer, the monomer 3 (5.0 mmol) as a B monomer, the monomer 1 (0.1 mmol) as a first T monomer (T1 monomer), the monomer 4 (1.9 mmol) as a second T monomer (T2 monomer), and anisole (8 mL), and the separately prepared aforementioned Pd catalyst solution (7.5 mL) was then added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use. Thereafter, a purification treatment was performed in the same manner as that described above for the charge transport polymer 1-1 to obtain a charge transport polymer 3-1 from which low-molecular weight components had not been removed.

<Syntheses of Charge Transport Polymers 3-2 to 3-5>

Using the same procedure as that described above for the charge transport polymer 3-1, a charge transport polymer 3-2, a charge transport polymer 3-3, a charge transport polymer 3-4 and a charge transport polymer 3-5 were synthesized. The combinations of monomers used in the various syntheses are shown in Table 3. The monomers for the aforementioned charge transport polymer 3-1, and charge transport polymers 3-6 and 3-7 described below are also shown in Table 3.

TABLE 3

| Charge transport polymer | L monomer | B monomer | T1 monomer | T2 monomer |
|---|---|---|---|---|
| Charge transport polymer 3-1 | Monomer 2 | Monomer 3 | Monomer 1 | Monomer 4 |
| Charge transport polymer 3-2 | Monomer 2 | Monomer 5 | Monomer 1 | Monomer 4 |
| Charge transport polymer 3-3 | Monomer 2 | Monomer 6 | Monomer 1 | Monomer 4 |
| Charge transport polymer 3-4 | Monomer 2 | Monomer 7 | Monomer 1 | Monomer 4 |
| Charge transport polymer 3-5 | Monomer 2 | Monomer 8 | Monomer 1 | Monomer 4 |
| Charge transport polymer 3-6 | Monomer 2 | Monomer 3 | Monomer 1 | — |
| Charge transport polymer 3-7 | Monomer 2 | Monomer 5 | Monomer 1 | — |

<Synthesis of Charge Transport Polymer 3-6>

With the exception of using 2.0 mmol of the aforementioned monomer 1 alone as the T monomer, a charge transport polymer 3-6 from which low-molecular weight components had not been removed was obtained in the same manner as that described for the charge transport polymer 3-1.

<Synthesis of Charge Transport Polymer 3-7>

With the exception of using the monomer 5 instead of the monomer 3 as the B monomer, a charge transport polymer 3-7 from which low-molecular weight components had not been removed was obtained in the same manner as the above charge transport polymer 3-6.

<Synthesis of Charge Transport Polymer 4-1>

A three-neck round-bottom flask was charged with the monomer 2 (4.0 mmol) as an L monomer, the monomer 3 (5.0 mmol) as a B monomer, the monomer 1 (0.1 mmol) as a first T monomer (T1 monomer), the monomer 4 (1.9 mmol) as a second T monomer (T2 monomer), and anisole (8 mL), and the separately prepared aforementioned Pd catalyst solution (7.5 mL) was then added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use. Thereafter, removal of low-molecular weight components and a purification treatment were performed in the same manner as that described above for the charge transport polymer 2-1 to obtain a charge transport polymer 4-1 from which low-molecular weight components had been removed.

<Syntheses of Charge Transport Polymers 4-2 to 4-5>

Using the same procedure as that described above for the charge transport polymer 4-1, a charge transport polymer 4-2, a charge transport polymer 4-3, a charge transport polymer 4-4 and a charge transport polymer 4-5 were synthesized. The combinations of monomers used in the various syntheses are shown in Table 4. The monomers for the aforementioned charge transport polymer 4-1, and charge transport polymers 4-6 and 4-7 described below are also shown in Table 4.

TABLE 4

| Charge transport polymer | L monomer | B monomer | T1 monomer | T2 monomer |
|---|---|---|---|---|
| Charge transport polymer 4-1 | Monomer 2 | Monomer 3 | Monomer 1 | Monomer 4 |
| Charge transport polymer 4-2 | Monomer 2 | Monomer 5 | Monomer 1 | Monomer 4 |
| Charge transport polymer 4-3 | Monomer 2 | Monomer 6 | Monomer 1 | Monomer 4 |
| Charge transport polymer 4-4 | Monomer 2 | Monomer 7 | Monomer 1 | Monomer 4 |
| Charge transport polymer 4-5 | Monomer 2 | Monomer 8 | Monomer 1 | Monomer 4 |
| Charge transport polymer 4-6 | Monomer 2 | Monomer 3 | Monomer 1 | — |
| Charge transport polymer 4-7 | Monomer 2 | Monomer 5 | Monomer 1 | — |

<Synthesis of Charge Transport Polymer 4-6>

With the exception of using 2.0 mmol of the aforementioned monomer 1 alone as the T monomer, a charge transport polymer 4-6 from which low-molecular weight components had been removed was obtained in the same manner as that described for the charge transport polymer 3-1.

<Synthesis of Charge Transport Polymer 4-7>

With the exception of using the monomer 5 instead of the monomer 3 as the B monomer, a charge transport polymer 4-7 from which low-molecular weight components had been removed was obtained in the same manner as the above charge transport polymer 4-6.

<Synthesis of Charge Transport Polymer 5-1>

A three-neck round-bottom flask was charged with the monomer 2 (4.0 mmol) as an L monomer, the monomer 3 (5.0 mmol) as a B monomer, the monomer 1 (0.1 mmol) as a first T monomer (T1 monomer), the monomer 4 (1.9 mmol) as a second T monomer (T2 monomer), and anisole (4 mL), and the separately prepared aforementioned Pd catalyst solution (7.5 mL) was then added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use. Thereafter, a purification treatment was performed in the same manner as that described above for the charge transport polymer 1-1 to obtain a charge transport polymer 5-1 from which low-molecular weight components had not been removed.

<Syntheses of Charge Transport Polymers 5-2 to 5-5>

Using the same procedure as that described above for the charge transport polymer 5-1, a charge transport polymer 5-2, a charge transport polymer 5-3, a charge transport polymer 5-4 and a charge transport polymer 5-5 were synthesized. The combinations of monomers used in the various syntheses are shown in Table 5. The monomers for the aforementioned charge transport polymer 5-1, and charge transport polymers 5-6 and 5-7 described below are also shown in Table 5.

TABLE 5

| Charge transport polymer | L monomer | B monomer | T1 monomer | T2 monomer |
|---|---|---|---|---|
| Charge transport polymer 5-1 | Monomer 2 | Monomer 3 | Monomer 1 | Monomer 4 |
| Charge transport polymer 5-2 | Monomer 2 | Monomer 5 | Monomer 1 | Monomer 4 |
| Charge transport polymer 5-3 | Monomer 2 | Monomer 6 | Monomer 1 | Monomer 4 |
| Charge transport polymer 5-4 | Monomer 2 | Monomer 7 | Monomer 1 | Monomer 4 |
| Charge transport polymer 5-5 | Monomer 2 | Monomer 8 | Monomer 1 | Monomer 4 |
| Charge transport polymer 5-6 | Monomer 2 | Monomer 3 | Monomer 1 | — |
| Charge transport polymer 5-7 | Monomer 2 | Monomer 5 | Monomer 1 | — |

<Synthesis of Charge Transport Polymer 5-6>

With the exception of using 2.0 mmol of the aforementioned monomer 1 alone as the T monomer, a charge transport polymer 5-6 from which low-molecular weight components had not been removed was obtained in the same manner as that described for the charge transport polymer 5-1.

<Synthesis of Charge Transport Polymer 5-7>

With the exception of using the monomer 5 instead of the monomer 3 as the B monomer, a charge transport polymer 5-7 from which low-molecular weight components had not been removed was obtained in the same manner as the above charge transport polymer 5-6.

<Synthesis of Charge Transport Polymer 6-1>

A three-neck round-bottom flask was charged with the monomer 2 (4.0 mmol) as an L monomer, the monomer 3 (5.0 mmol) as a B monomer, the monomer 1 (0.1 mmol) as a first T monomer (T1 monomer), the monomer 4 (1.9 mmol) as a second T monomer (T2 monomer), and anisole (4 mL), and the separately prepared aforementioned Pd catalyst solution (7.5 mL) was then added. After stirring for 30 minutes, a 10% aqueous solution of tetraethylammonium hydroxide (20 mL) was added. The resulting mixture was heated and refluxed for 2 hours. All the operations up to this point were conducted under a stream of nitrogen. Further, all of the solvents were deaerated by nitrogen bubbling for at least 30 minutes prior to use. Thereafter, removal of low-molecular weight components and a purification treatment were performed in the same manner as that described above for the charge transport polymer 2-1 to obtain a charge transport polymer 6-1 from which low-molecular weight components had been removed.

<Syntheses of Charge Transport Polymers 6-2 to 6-5>

Using the same procedure as that described above for the charge transport polymer 6-1, a charge transport polymer 6-2, a charge transport polymer 6-3, a charge transport polymer 6-4 and a charge transport polymer 6-5 were synthesized. The combinations of monomers used in the various syntheses are shown in Table 6. The monomers for the aforementioned charge transport polymer 6-1, and charge transport polymers 6-6 and 6-7 described below are also shown in Table 6.

TABLE 6

| Charge transport polymer | L monomer | B monomer | T1 monomer | T2 monomer |
|---|---|---|---|---|
| Charge transport polymer 6-1 | Monomer 2 | Monomer 3 | Monomer 1 | Monomer 4 |
| Charge transport polymer 6-2 | Monomer 2 | Monomer 5 | Monomer 1 | Monomer 4 |
| Charge transport polymer 6-3 | Monomer 2 | Monomer 6 | Monomer 1 | Monomer 4 |
| Charge transport polymer 6-4 | Monomer 2 | Monomer 7 | Monomer 1 | Monomer 4 |
| Charge transport polymer 6-5 | Monomer 2 | Monomer 8 | Monomer 1 | Monomer 4 |
| Charge transport polymer 6-6 | Monomer 2 | Monomer 3 | Monomer 1 | — |
| Charge transport polymer 6-7 | Monomer 2 | Monomer 5 | Monomer 1 | — |

<Synthesis of Charge Transport Polymer 6-6>

With the exception of using 2.0 mmol of the aforementioned monomer 1 alone as the T monomer, a charge transport polymer 6-6 from which low-molecular weight components had been removed was obtained in the same manner as that described for the charge transport polymer 6-1.

<Synthesis of Charge Transport Polymer 6-7>

With the exception of using the monomer 5 instead of the monomer 3 as the B monomer, a charge transport polymer 6-7 from which low-molecular weight components had been removed was obtained in the same manner as the above charge transport polymer 6-6.

The weight average molecular weight, the number average molecular weight, and the proportion (GPC chart area ratio) of low-molecular weight components for each of the obtained polymers were determined by GPC measurements. The GPC measurement conditions were as described above. The obtained values are shown in Table 7.

TABLE 7

| | Weight average molecular weight | Number average molecular weight | Low-molecular weight ratio (%) |
|---|---|---|---|
| Charge transport polymer 1-1 | 29,000 | 9,300 | 52.2 |
| Charge transport polymer 1-2 | 31,500 | 1,600 | 42.1 |
| Charge transport polymer 1-3 | 31,400 | 2,000 | 49.1 |

TABLE 7-continued

| | Weight average molecular weight | Number average molecular weight | Low-molecular weight ratio (%) |
|---|---|---|---|
| Charge transport polymer 1-4 | 39,600 | 1,900 | 56.5 |
| Charge transport polymer 1-5 | 30,100 | 1,600 | 47.1 |
| Charge transport polymer 1-6 | 29,800 | 1,700 | 52.3 |
| Charge transport polymer 1-7 | 32,400 | 1,900 | 48.1 |
| Charge transport polymer 2-1 | 33,600 | 13,000 | 37.5 |
| Charge transport polymer 2-2 | 35,900 | 15,400 | 36.9 |
| Charge transport polymer 2-3 | 30,500 | 14,200 | 35.1 |
| Charge transport polymer 2-4 | 40,800 | 13,400 | 35.9 |
| Charge transport polymer 2-5 | 37,400 | 18,300 | 36.7 |
| Charge transport polymer 2-6 | 42,800 | 19,900 | 34.9 |
| Charge transport polymer 2-7 | 39,600 | 15,400 | 35.1 |
| Charge transport polymer 3-1 | 72,200 | 5,200 | 43.0 |
| Charge transport polymer 3-2 | 79,900 | 2,100 | 45.1 |
| Charge transport polymer 3-3 | 97,800 | 2,200 | 48.7 |
| Charge transport polymer 3-4 | 76,800 | 1,900 | 41.9 |
| Charge transport polymer 3-5 | 89,700 | 2,300 | 43.4 |
| Charge transport polymer 3-6 | 92,100 | 2,100 | 43.1 |
| Charge transport polymer 3-7 | 87,600 | 1,900 | 49.5 |
| Charge transport polymer 4-1 | 79,500 | 32,000 | 19.2 |
| Charge transport polymer 4-2 | 80,500 | 47,200 | 18.5 |
| Charge transport polymer 4-3 | 96,300 | 39,800 | 17.6 |
| Charge transport polymer 4-4 | 97,500 | 48,700 | 16.9 |
| Charge transport polymer 4-5 | 87,900 | 42,100 | 15.4 |
| Charge transport polymer 4-6 | 97,600 | 34,500 | 18.2 |
| Charge transport polymer 4-7 | 89,700 | 36,700 | 16.7 |
| Charge transport polymer 5-1 | 186,200 | 8,200 | 51.6 |
| Charge transport polymer 5-2 | 235,600 | 2,100 | 48.1 |
| Charge transport polymer 5-3 | 241,000 | 2,700 | 44.2 |
| Charge transport polymer 5-4 | 194,300 | 2,400 | 46.8 |
| Charge transport polymer 5-5 | 156,400 | 1,800 | 48.3 |
| Charge transport polymer 5-6 | 186,300 | 2,900 | 49.2 |
| Charge transport polymer 5-7 | 175,400 | 1,900 | 52.4 |
| Charge transport polymer 6-1 | 195,000 | 42,000 | 14.9 |
| Charge transport polymer 6-2 | 246,500 | 54,600 | 13.2 |
| Charge transport polymer 6-3 | 251,100 | 57,400 | 11.9 |
| Charge transport polymer 6-4 | 202,100 | 40,800 | 16.3 |
| Charge transport polymer 6-5 | 175,400 | 47,200 | 16.7 |
| Charge transport polymer 6-6 | 213,400 | 51,400 | 15.3 |
| Charge transport polymer 6-7 | 198,400 | 48,700 | 16.3 |

Figure 3:
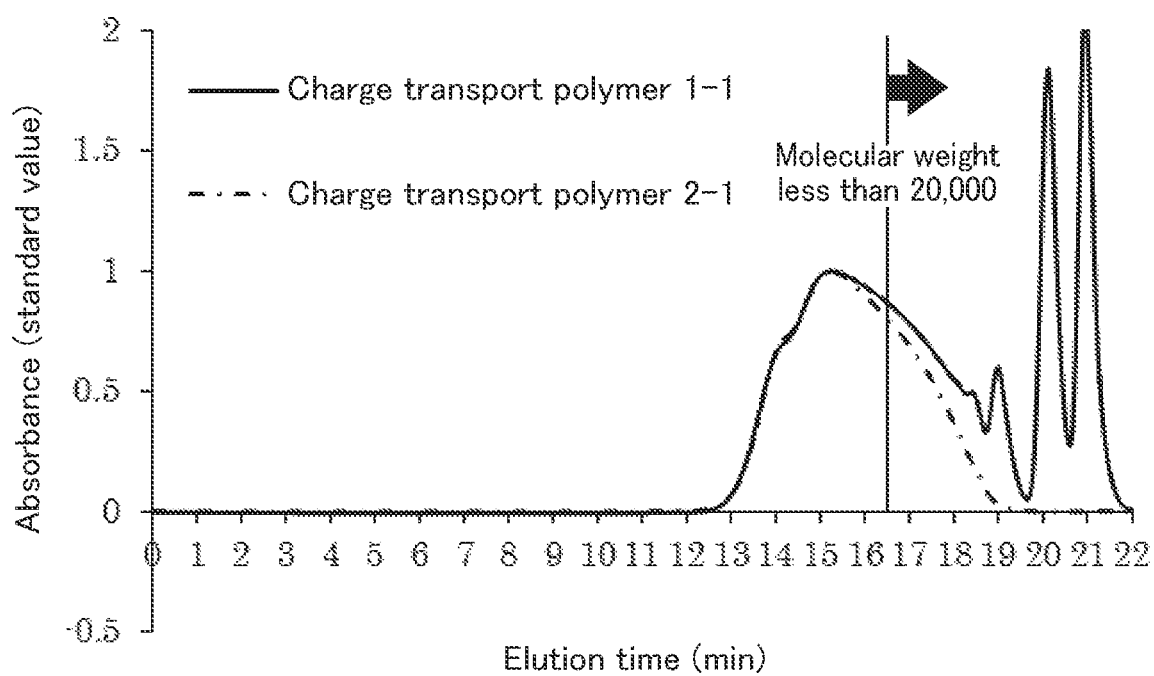
FIG. 3 is a GPC measurement chart before and after removal of low-molecular weight components from one example of a charge transport polymer contained in an organic electronic material according to an embodiment of the present invention.

FIG. 3 shows superimposed GPC measurement charts for the charge transport polymer 1-1 and the charge transport polymer 2-1 described above. The figure shows that because the charge transport polymer 2-1 is a polymer from which low-molecular weight components have been removed, the amount of components having a molecular weight of less than 20,000 has been reduced compared with the charge transport polymer 1-1 from which low-molecular weight components have not been removed.

<Evaluations of Organic Layer Formation and Residual Film Ratio>

Comparative Example 1-1

A coating solution obtained by mixing a solution prepared by dissolving the charge transport polymer 1-1 (10 mg) in 1,100 μL of toluene and a solution prepared by dissolving an ionic compound 1 (1 mg) represented by a chemical formula shown below in 50 μL of toluene was spin coated at 3,000 rpm onto a quartz plate. Subsequently, heating was performed at 180° C. for 10 minutes on a hotplate to cause a polymerization reaction. Following heating, the quartz plate was washed by immersion in toluene solvent for 10 seconds.

[Chemical formula 9]

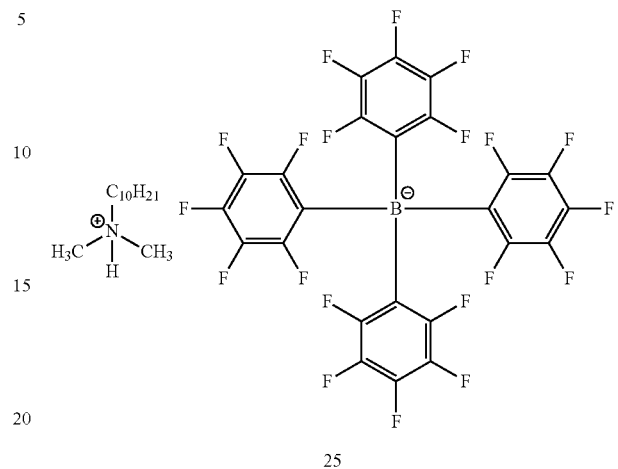

Ionic compound 1

The UV-VIS (ultraviolet-visible) spectrum was measured before and after the washing by immersion in toluene solvent, and the residual film ratio was calculated from the ratio between the absorbances (Abs) at the absorption maxima (λmax) in the obtained spectra.

Before washing: λmax=383 nm, Abs=0.229
After washing: λmax=383 nm, Abs=0.180

Residual film ratio (%) =

Abs after washing/Abs before washing × 100 =

$$(0.180/0.229) \times 100 = 78.6$$

Measurements of the UV-VIS spectra were performed under the following conditions.
Apparatus: U-3900H spectrophotometer (Hitachi High-Technologies Corporation)
Slit: 2 nm
Scan speed: 600 nm/min
Start wavelength: 500 nm
End wavelength: 250 nm
Reference: quartz substrate Examples 1-1 to 1-7, 2-1 to 2-7, 3-1 to 3-7; and Comparative Examples 1-2 to 1-7, 2-1 to 2-7, and 3-1 to 3-7

With the exception of using one of the charge transport polymers shown below in Table 8 instead of the charge transport polymer 1-1, an organic layer was formed and the residual film ratio was measured in the same manner as that described above for Comparative Example 1-1. The results are shown in Table 8.

TABLE 8

| | Polymer used | Residual film ratio (%) |
|---|---|---|
| Comparative Example 1-1 | Charge transport polymer 1-1 | 78.6 |
| Comparative Example 1-2 | Charge transport polymer 1-2 | 64.8 |
| Comparative Example 1-3 | Charge transport polymer 1-3 | 80.5 |
| Comparative Example 1-4 | Charge transport polymer 1-4 | 81.9 |

TABLE 8-continued

| | Polymer used | Residual film ratio (%) |
|---|---|---|
| Comparative Example 1-5 | Charge transport polymer 1-5 | 84.2 |
| Comparative Example 1-6 | Charge transport polymer 1-6 | 95.0 |
| Comparative Example 1-7 | Charge transport polymer 1-7 | 93.1 |
| Example 1-1 | Charge transport polymer 2-1 | 90.8 |
| Example 1-2 | Charge transport polymer 2-2 | 91.1 |
| Example 1-3 | Charge transport polymer 2-3 | 90.1 |
| Example 1-4 | Charge transport polymer 2-4 | 89.9 |
| Example 1-5 | Charge transport polymer 2-5 | 92.4 |
| Example 1-6 | Charge transport polymer 2-6 | 98.4 |
| Example 1-7 | Charge transport polymer 2-7 | 97.2 |
| Comparative Example 2-1 | Charge transport polymer 3-1 | 85.0 |
| Comparative Example 2-2 | Charge transport polymer 3-2 | 82.3 |
| Comparative Example 2-3 | Charge transport polymer 3-3 | 84.9 |
| Comparative Example 2-4 | Charge transport polymer 3-4 | 86.7 |
| Comparative Example 2-5 | Charge transport polymer 3-5 | 84.4 |
| Comparative Example 2-6 | Charge transport polymer 3-6 | 97.6 |
| Comparative Example 2-7 | Charge transport polymer 3-7 | 98.4 |
| Example 2-1 | Charge transport polymer 4-1 | 97.2 |
| Example 2-2 | Charge transport polymer 4-2 | 98.1 |
| Example 2-3 | Charge transport polymer 4-3 | 97.8 |
| Example 2-4 | Charge transport polymer 4-4 | 99.7 |
| Example 2-5 | Charge transport polymer 4-5 | 99.3 |
| Example 2-6 | Charge transport polymer 4-6 | 100.0 |
| Example 2-7 | Charge transport polymer 4-7 | 100.0 |
| Comparative Example 3-1 | Charge transport polymer 5-1 | 91.6 |
| Comparative Example 3-2 | Charge transport polymer 5-2 | 90.0 |
| Comparative Example 3-3 | Charge transport polymer 5-3 | 92.1 |
| Comparative Example 3-4 | Charge transport polymer 5-4 | 90.8 |
| Comparative Example 3-5 | Charge transport polymer 5-5 | 93.2 |
| Comparative Example 3-6 | Charge transport polymer 5-6 | 99.4 |
| Comparative Example 3-7 | Charge transport polymer 5-7 | 99.3 |
| Example 3-1 | Charge transport polymer 6-1 | 99.8 |
| Example 3-2 | Charge transport polymer 6-2 | 98.1 |
| Example 3-3 | Charge transport polymer 6-3 | 99.2 |
| Example 3-4 | Charge transport polymer 6-4 | 97.9 |
| Example 3-5 | Charge transport polymer 6-5 | 99.4 |
| Example 3-6 | Charge transport polymer 6-6 | 100.0 |
| Example 3-7 | Charge transport polymer 6-7 | 100.0 |

Based on the results in Table 8, it is evident that the charge transport polymers of the Examples exhibited improved curability due to having a GPC chart area ratio of not more than 40% for low-molecular weight components. In this manner, in the Examples, superior curability could be achieved without requiring an increase in the molecular weight.

<Production of Organic EL Elements>

Comparative Example 4-1

A PEDOT:PSS dispersion (AI4083 LVW142, manufactured by H.C. Starck-V-Tech Ltd.) was applied by spin coating at a revolution rate of 1,500 min$^{-1}$ to a glass substrate on which ITO had been patterned with a width of 1.6 mm, and the applied coating was dried by heating on a hotplate in the open air at 200° C. for 10 minutes, thus forming a hole injection layer (40 nm). The subsequent experiments were all performed under a dry nitrogen atmosphere.

The charge transport polymer 3-1 (4.5 mg), the ionic compound 1 described above (0.13 mg) and toluene (1.2 mL) were mixed together to prepare an ink composition for forming a hole transport layer. This ink composition was spin-coated onto the hole injection layer obtained above at a revolution rate of 3,000 min$^{-1}$, and was then cured by heating on a hotplate at 120° C. for 10 minutes, thus forming a hole transport layer (40 nm).

The thus obtained glass substrate was transferred into a vacuum deposition apparatus, and layers of CBP:Ir(ppy)$_3$ (94:6, 30 nm), BAlq (10 nm), Alq$_3$ (30 nm), LiF (0.8 nm) and Al (100 nm) were deposited in that order on top of the hole transport layer to form a light-emitting layer, a hole blocking layer, an electron transport layer, an electron injection layer and a cathode respectively.

Following formation of the electrode, the layered glass substrate was transferred under a dry nitrogen atmosphere without exposure to the external atmosphere, and was bonded, using a photocurable epoxy resin, to an encapsulating glass having a countersink of 0.4 mm formed in an alkali-free glass with a thickness of 0.7 mm, thus completing encapsulation and production of a polymeric organic EL element having a multilayer structure.

Comparative Examples 4-2 to 4-7

With the exception of forming the hole transport layer using one of the polymers shown in Table 9 instead of the charge transport polymer 3-1, organic EL elements were produced in the same manner as Comparative Example 4-1.

TABLE 9

| | Polymer used |
|---|---|
| Comparative Example 4-1 | Charge transport polymer 3-1 |
| Comparative Example 4-2 | Charge transport polymer 3-2 |
| Comparative Example 4-3 | Charge transport polymer 3-3 |
| Comparative Example 4-4 | Charge transport polymer 3-4 |
| Comparative Example 4-5 | Charge transport polymer 3-5 |
| Comparative Example 4-6 | Charge transport polymer 3-6 |
| Comparative Example 4-7 | Charge transport polymer 3-7 |

Example 4-1

With the exception of forming the hole transport layer using the charge transport polymer 4-1 instead of the charge transport polymer 3-1, an organic EL element was produced in the same manner as Comparative Example 4-1.

Examples 4-2 to 4-7

With the exception of forming the hole transport layer using one of the polymers shown in Table 10 instead of the charge transport polymer 3-1, organic EL elements were produced in the same manner as Comparative Example 4-1.

TABLE 10

| | Polymer used |
|---|---|
| Example 4-1 | Charge transport polymer 4-1 |
| Example 4-2 | Charge transport polymer 4-2 |
| Example 4-3 | Charge transport polymer 4-3 |
| Example 4-4 | Charge transport polymer 4-4 |
| Example 4-5 | Charge transport polymer 4-5 |
| Example 4-6 | Charge transport polymer 4-6 |
| Example 4-7 | Charge transport polymer 4-7 |

Comparative Example 5-1

The charge transport polymer 3-1 (4.5 mg), the ionic compound 1 described above (0.13 mg) and toluene (500 μL) were mixed together to prepare an ink composition for forming a hole injection layer. The subsequent experiments were all performed under a dry nitrogen atmosphere.

The above ink composition was applied by spin coating at a revolution rate of 3,000 min$^{-1}$ to a glass substrate on which ITO had been patterned with a width of 1.6 mm, and the applied coating was then cured by heating on a hotplate at 120° C. for 10 minutes, thus forming a hole injection layer (40 nm).

Subsequently, the thus obtained glass substrate was transferred into a vacuum deposition apparatus, and layers of αNPD (20 nm), CBP:Ir(ppy)$_3$ (94:6, 30 nm), BAlq (10 nm), Alq$_3$ (30 nm), LiF (0.8 nm) and Al (100 nm) were deposited in that order on top of the hole injection layer to form a hole transport layer, a light-emitting layer, a hole blocking layer, an electron transport layer, an electron injection layer and a cathode respectively.

Following formation of the electrode, the layered glass substrate was transferred under a dry nitrogen atmosphere without exposure to the external atmosphere, and was bonded, using a photocurable epoxy resin, to an encapsulating glass having a countersink of 0.4 mm formed in an alkali-free glass with a thickness of 0.7 mm, thus completing encapsulation and production of a polymeric organic EL element having a multilayer structure.

Comparative Examples 5-2 to 5-7

With the exception of forming the hole injection layer using one of the polymers shown in Table 11 instead of the charge transport polymer 3-1, organic EL elements were produced in the same manner as Comparative Example 5-1.

TABLE 11

|  | Polymer used |
| --- | --- |
| Comparative Example 5-1 | Charge transport polymer 3-1 |
| Comparative Example 5-2 | Charge transport polymer 3-2 |
| Comparative Example 5-3 | Charge transport polymer 3-3 |
| Comparative Example 5-4 | Charge transport polymer 3-4 |
| Comparative Example 5-5 | Charge transport polymer 3-5 |
| Comparative Example 5-6 | Charge transport polymer 3-6 |
| Comparative Example 5-7 | Charge transport polymer 3-7 |

Example 5-1

With the exception of forming the hole injection layer using the charge transport polymer 4-1 instead of the charge transport polymer 3-1, an organic EL element was produced in the same manner as Comparative Example 5-1.

Examples 5-2 to 5-7

With the exception of forming the hole injection layer using one of the polymers shown in Table 12 instead of the charge transport polymer 3-1, organic EL elements were produced in the same manner as Comparative Example 5-1.

TABLE 12

|  | Polymer used |
| --- | --- |
| Example 5-1 | Charge transport polymer 4-1 |
| Example 5-2 | Charge transport polymer 4-2 |
| Example 5-3 | Charge transport polymer 4-3 |
| Example 5-4 | Charge transport polymer 4-4 |
| Example 5-5 | Charge transport polymer 4-5 |
| Example 5-6 | Charge transport polymer 4-6 |
| Example 5-7 | Charge transport polymer 4-7 |

A voltage was applied to each of the organic EL elements obtained in the above Examples 4-1 to 4-7, and 5-1 to 5-7, and the Comparative Examples 4-1 to 4-7 and 5-1 to 5-7, and the light emission performance was evaluated. The results confirmed a green light emission from each element. For each element, the drive voltage and emission efficiency at a luminance of 1,000 cd/m$^2$, and the emission lifespan (luminance half-life) when the initial luminance was 3,000 cd/m$^2$ were measured. The measurement results are shown in Table 13.

TABLE 13

|  | Drive voltage (V) | Emission efficiency (cd/A) | Emission lifespan (h) |
| --- | --- | --- | --- |
| Comparative Example 4-1 | 7.6 | 16.8 | 65.2 |
| Comparative Example 4-2 | 8.1 | 20.3 | 75.9 |
| Comparative Example 4-3 | 7.8 | 18.6 | 59.6 |
| Comparative Example 4-4 | 8.1 | 22.6 | 84.4 |
| Comparative Example 4-5 | 6.9 | 21.3 | 85.4 |
| Comparative Example 4-6 | 6.7 | 16.8 | 67.1 |
| Comparative Example 4-7 | 7.5 | 20.5 | 78.6 |
| Example 4-1 | 7.0 | 20.9 | 98.6 |
| Example 4-2 | 7.5 | 24.1 | 102.7 |
| Example 4-3 | 7.6 | 19.3 | 67.9 |
| Example 4-4 | 7.5 | 28.9 | 96.6 |
| Example 4-5 | 6.5 | 25.6 | 104.1 |
| Example 4-6 | 6.5 | 21.0 | 100.2 |
| Example 4-7 | 7.3 | 24.9 | 98.7 |
| Comparative Example 5-1 | 7.4 | 12.5 | 48.7 |
| Comparative Example 5-2 | 7.0 | 16.8 | 42.1 |
| Comparative Example 5-3 | 7.3 | 17.4 | 34.2 |
| Comparative Example 5-4 | 7.6 | 14.3 | 20.9 |
| Comparative Example 5-5 | 7.8 | 15.2 | 39.1 |
| Comparative Example 5-6 | 7.5 | 12.5 | 43.5 |
| Comparative Example 5-7 | 7.1 | 16.9 | 45.6 |
| Example 5-1 | 6.8 | 15.3 | 70.7 |
| Example 5-2 | 6.9 | 18.0 | 60.1 |
| Example 5-3 | 7.1 | 19.8 | 58.3 |
| Example 5-4 | 7.4 | 16.3 | 56.7 |
| Example 5-5 | 7.7 | 16.1 | 46.5 |
| Example 5-6 | 6.8 | 17.1 | 72.3 |
| Example 5-7 | 6.9 | 18.2 | 66.1 |

As is evident from Table 13, the organic EL elements of the Examples had a lower drive voltage, superior emission efficiency and a longer lifespan than the elements of the Comparative Examples. In other words, by using a charge transport polymer having a smaller amount of low-molecular weight components, the remarkable effects of improved emission efficiency and improved emission lifespan were obtained.

The disclosure within this Application is related to the subject matter disclosed in prior Japanese Application 2015-178625 filed on Sep. 10, 2015, the entire contents of which are incorporated by reference herein.

It should be noted that, besides the embodiments already described above, various modifications and variations can be made in these embodiments without departing from the novel and advantageous features of the present invention. Accordingly, it is intended that all such modifications and variations are included within the scope of the appended claims.

DESCRIPTION OF THE REFERENCE SIGNS

1: Light-emitting layer
2: Anode
3: Hole injection layer
4: Cathode
5: Electron injection layer
6: Hole transport layer
7: Electron transport layer
8: Substrate

The invention claimed is:

1. An organic electronic material comprising a charge transport polymer having a polymerizable functional group at least at a terminal portion of the charge transport polymer and for which, in a molecular weight distribution chart measured by GPC, an area ratio accounted for by components having a molecular weight of less than 20,000 is not more than 40%, and an area ratio accounted for by components having a molecular weight of 500 or less is not more than 1%.

2. An organic electronic material comprising a charge transport polymer having a polymerizable functional group at least at a terminal portion of the charge transport polymer and from which components having a molecular weight of less than 20,000 have been removed, and for which, in a molecular weight distribution chart measured by GPC, an area ratio accounted for by components having a molecular weight of less than 20,000 is not more than 40%.

3. The organic electronic material according to claim 1, wherein a dispersity (weight average molecular weight/number average molecular weight) of the charge transport polymer is 2.0 or greater.

4. A method for producing an organic electronic material comprising a charge transport polymer having a polymerizable functional group at least at a terminal portion of the charge transport polymer and for which, in a molecular weight distribution chart measured by GPC, an area ratio accounted for by components having a molecular weight of less than 20,000 is not more than 40%,
the method comprising removing components having a molecular weight of less than 20,000 from the charge transport polymer.

5. The method for producing an organic electronic material according to claim 4, wherein a dispersity (weight average molecular weight/number average molecular weight) of the charge transport polymer following removal of components having a molecular weight of less than 20,000 is 2.0 or greater.

6. An ink composition comprising the organic electronic material according to claim 1, and a solvent.

7. An organic layer formed using the organic electronic material according to claim 1.

8. An organic electronic element comprising at least one of the organic layer according to claim 7.

9. An organic electroluminescent element comprising at least one of the organic layer according to claim 7.

10. The organic electroluminescent element according to claim 9, further comprising a flexible substrate.

11. The organic electroluminescent element according to claim 9, further comprising a resin film substrate.

12. A display element comprising the organic electroluminescent element according to claim 9.

13. An illumination device comprising the organic electroluminescent element according to claim 9.

14. A display device comprising the illumination device according to claim 13, and a liquid crystal element as a display unit.

15. The organic electronic material according to claim 2, wherein a dispersity (weight average molecular weight/number average molecular weight) of the charge transport polymer is 2.0 or greater.

16. An organic layer formed using the organic electronic material according to claim 2.

17. An organic electronic element comprising at least one of the organic layer according to claim 16.

18. An organic electroluminescent element comprising at least one organic layer according to claim 16.

19. A display element comprising the organic electroluminescent element according to claim 18.

20. An illumination device comprising the organic electroluminescent element according to claim 18.

21. The organic electronic material according to claim 1, wherein the charge transport polymer comprises a trivalent or higher structural unit that constitutes a branched portion.

22. The organic electronic material according to claim 2, wherein the charge transport polymer comprises a trivalent or higher structural unit that constitutes a branched portion.

23. The method according to claim 4, wherein the charge transport polymer comprises a trivalent or higher structural unit that constitutes a branched portion.

* * * * *